(12) United States Patent
Cho et al.

(10) Patent No.: US 12,079,146 B2
(45) Date of Patent: Sep. 3, 2024

(54) MEMORY MODULE, MAIN BOARD, AND SERVER DEVICE

(71) Applicant: SAMSUNG ELECTRONICS CO., LTD., Suwon-si (KR)

(72) Inventors: Jeonghyeon Cho, Hwaseong-si (KR); Yongsuk Kwon, Goyang-si (KR); Kyungsoo Kim, Seoul (KR); Jonghoon Kim, Seoul (KR); Jonghyun Seok, Seoul (KR); Jonggeon Lee, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 303 days.

(21) Appl. No.: 17/383,056

(22) Filed: Jul. 22, 2021

(65) Prior Publication Data

US 2022/0206968 A1 Jun. 30, 2022

(30) Foreign Application Priority Data

Dec. 30, 2020 (KR) ........................ 10-2020-0187164

(51) Int. Cl.
*H05K 1/02* (2006.01)
*G06F 1/20* (2006.01)
(Continued)

(52) U.S. Cl.
CPC ...... *G06F 13/1673* (2013.01); *G06F 13/4068* (2013.01); *G06F 13/409* (2013.01); *G11C 5/06* (2013.01); *G11C 7/1063* (2013.01)

(58) Field of Classification Search
CPC .. H05K 1/02; H05K 1/14; H05K 1/16; H05K 1/18; H05K 1/111; H05K 1/117; H05K 1/118; H05K 1/141; H05K 1/142; H05K 1/147; H05K 1/181; H05K 1/184; H05K 1/189; H05K 3/36; H05K 3/303; H05K 7/02; H05K 7/20; H05K 7/20236; H05K 7/20509; G06F 1/20; G06F 1/30; G06F 1/185; G06F 1/266; G06F 1/2203;
(Continued)

(56) References Cited

U.S. PATENT DOCUMENTS

| 4,025,903 A | * | 5/1977 | Kaufman | ............ G06F 12/0676 |
| | | | | 711/E12.088 |
| RE31,318 E | * | 7/1983 | Kaufman | ............ G06F 12/0676 |
| | | | | 711/201 |

(Continued)

FOREIGN PATENT DOCUMENTS

| CN | 101202102 A | 6/2008 |
| CN | 104050064 A | 9/2014 |

(Continued)

OTHER PUBLICATIONS

Taiwanese Office action dated May 24, 2022.

*Primary Examiner* — Xiaoliang Chen
(74) *Attorney, Agent, or Firm* — Muir Patent Law, PLLC

(57) ABSTRACT

A memory module includes a memory substrate including a main connector and an auxiliary connector, configured to be connected to an external device; and a plurality of memory chips mounted on at least one of a first surface or a second surface of the memory substrate, wherein the main connector is disposed on one side of the memory substrate, and the auxiliary connector is disposed on the second surface of the memory substrate.

8 Claims, 17 Drawing Sheets

(51) Int. Cl.
*G06F 1/30* (2006.01)
*G06F 13/12* (2006.01)
*G06F 13/16* (2006.01)
*G06F 13/364* (2006.01)
*G06F 13/40* (2006.01)
*G11C 5/04* (2006.01)
*G11C 5/06* (2006.01)
*G11C 7/10* (2006.01)
*H05K 1/14* (2006.01)
*H05K 1/16* (2006.01)
*H05K 1/18* (2006.01)
*H05K 3/36* (2006.01)
*H05K 7/02* (2006.01)
*H05K 7/20* (2006.01)

(58) Field of Classification Search
CPC .......... G06F 13/04; G06F 13/12; G06F 13/40; G06F 13/165; G06F 13/364; G06F 13/409; G06F 13/0412; G06F 13/0416; G06F 13/0481; G06F 13/1673; G06F 13/4068; G11C 5/04; G11C 5/06; G11C 7/1063
USPC ....... 361/748, 679.31, 752; 710/5, 6, 52, 62, 710/74, 300, 301, 302; 711/103, 104, 711/115, 200, E12.001, E12.008
See application file for complete search history.

(56) References Cited

U.S. PATENT DOCUMENTS

| | | | |
|---|---|---|---|
| 4,430,716 A * | 2/1984 | Dlugos | G07B 17/00661 177/25.15 |
| 5,524,232 A * | 6/1996 | Hajeer | G06F 13/409 711/115 |
| 5,553,202 A * | 9/1996 | Wakabayashi | G06K 15/00 358/1.15 |
| 6,108,731 A * | 8/2000 | Suzuki | G06F 1/186 710/2 |
| 6,170,035 B1 | 1/2001 | Gianellini et al. | |
| 6,272,628 B1 * | 8/2001 | Aguilar | G06F 9/4401 713/2 |
| 6,289,449 B1 * | 9/2001 | Aguilar | G06F 11/1417 714/E11.133 |
| 6,415,387 B1 * | 7/2002 | Aguilar | G06F 1/3203 709/224 |
| 6,450,832 B1 * | 9/2002 | Aguilar | H01R 4/2425 439/490 |
| 6,491,526 B2 * | 12/2002 | Leman | H01R 12/721 361/752 |
| 7,116,241 B2 * | 10/2006 | Post | G06F 13/4081 340/693.9 |
| 7,133,962 B2 | 11/2006 | Leddige et al. | |
| 7,246,278 B2 * | 7/2007 | Stocken | G11C 29/56 714/718 |
| 7,334,070 B2 | 2/2008 | Borkenhagen et al. | |
| 7,729,153 B2 | 6/2010 | Dreps et al. | |
| 8,225,006 B1 * | 7/2012 | Karamcheti | G06F 11/108 714/6.21 |
| 8,341,300 B1 * | 12/2012 | Karamcheti | G06F 13/1642 710/52 |
| 8,429,318 B1 * | 4/2013 | Karamcheti | G06F 13/1657 710/62 |
| 8,516,172 B1 * | 8/2013 | Karamcheti | G06F 3/0659 710/62 |
| 8,539,145 B1 | 9/2013 | Warnes et al. | |
| 8,631,193 B2 | 1/2014 | Smith et al. | |
| 8,747,132 B1 * | 6/2014 | Feroli | H01R 13/62994 439/160 |
| 8,949,555 B1 * | 2/2015 | Karamcheti | G06F 13/1657 711/158 |
| 9,496,633 B1 | 11/2016 | Huang et al. | |
| 9,727,112 B1 * | 8/2017 | Karamcheti | G06F 1/266 |
| 9,804,931 B2 | 10/2017 | Woo et al. | |
| 9,972,369 B2 | 5/2018 | Haywood et al. | |
| 10,042,726 B2 | 8/2018 | Kim et al. | |
| 10,387,259 B2 | 8/2019 | Kumar et al. | |
| 10,733,119 B2 | 8/2020 | Yun et al. | |
| 10,896,698 B2 * | 1/2021 | Chang | H05K 1/0243 |
| 10,910,746 B2 * | 2/2021 | Aoki | H05K 7/20727 |
| 2002/0010835 A1 * | 1/2002 | Post | G06F 13/409 711/115 |
| 2002/0065971 A1 * | 5/2002 | Farnworth | G06F 1/184 710/301 |
| 2003/0077925 A1 * | 4/2003 | Cermak, III | G06F 1/184 439/74 |
| 2003/0172216 A1 * | 9/2003 | Gundacker | H05K 1/141 710/300 |
| 2006/0245226 A1 | 11/2006 | Stewart | |
| 2006/0256603 A1 * | 11/2006 | Foster, Sr. | G11C 5/04 365/63 |
| 2007/0019390 A1 * | 1/2007 | Peterson | G06F 1/185 361/728 |
| 2008/0077761 A1 | 3/2008 | Subashchandrabose et al. | |
| 2008/0082731 A1 * | 4/2008 | Karamcheti | G11C 7/1072 711/E12.008 |
| 2008/0082732 A1 * | 4/2008 | Karamcheti | G06F 13/1657 711/E12.008 |
| 2008/0082733 A1 * | 4/2008 | Karamcheti | G06F 12/0638 711/E12.008 |
| 2008/0082734 A1 * | 4/2008 | Karamcheti | G06F 13/1657 711/E12.008 |
| 2008/0082751 A1 * | 4/2008 | Okin | G06F 12/0246 711/E12.001 |
| 2009/0210616 A1 * | 8/2009 | Karamcheti | G11C 5/04 711/E12.001 |
| 2010/0257416 A1 * | 10/2010 | Lee | G11C 5/04 714/E11.159 |
| 2012/0099268 A1 * | 4/2012 | Hartman | G06F 1/20 361/807 |
| 2012/0250264 A1 | 10/2012 | Osanai et al. | |
| 2013/0138844 A1 * | 5/2013 | Karamcheti | G06F 13/12 710/74 |
| 2013/0222999 A1 * | 8/2013 | Wiltzius | G06F 1/20 361/679.31 |
| 2014/0071616 A1 * | 3/2014 | Watanabe | H05K 7/20772 361/679.47 |
| 2015/0134868 A1 * | 5/2015 | Shaeffer | G06F 13/4063 710/300 |
| 2015/0332768 A1 * | 11/2015 | Karamcheti | G06F 7/78 365/185.18 |
| 2016/0092384 A1 * | 3/2016 | Karamcheti | G06F 13/1673 710/300 |
| 2016/0147648 A1 | 5/2016 | Niu et al. | |
| 2016/0299767 A1 * | 10/2016 | Mukadam | G06F 13/426 |
| 2017/0295647 A1 | 10/2017 | Huang et al. | |
| 2019/0042162 A1 | 2/2019 | McCall et al. | |
| 2019/0042516 A1 | 2/2019 | Browning et al. | |
| 2019/0045634 A1 * | 2/2019 | Hill | H05K 1/141 |
| 2019/0098798 A1 * | 3/2019 | Franz | H05K 7/20509 |
| 2019/0102294 A1 | 4/2019 | Kang et al. | |
| 2019/0179382 A1 * | 6/2019 | Saito | G06F 1/20 |
| 2019/0208664 A1 * | 7/2019 | Saito | H05K 7/02 |
| 2019/0289748 A1 * | 9/2019 | Saito | H05K 7/02 |
| 2019/0294220 A1 * | 9/2019 | Saito | G06F 1/20 |
| 2020/0004685 A1 * | 1/2020 | Guim Bernat | G06F 12/1027 |
| 2020/0083623 A1 | 3/2020 | Huang | |
| 2020/0349983 A1 * | 11/2020 | Leung | G11C 5/04 |
| 2022/0029322 A1 * | 1/2022 | Schnell | H01R 12/592 |

FOREIGN PATENT DOCUMENTS

| | | |
|---|---|---|
| CN | 106776420 A | 5/2017 |
| EP | 0880142 A1 | 11/1998 |

* cited by examiner

MEMORY MODULE, MAIN BOARD, AND SERVER DEVICE

CROSS-REFERENCE TO RELATED APPLICATION

Korean Patent Application No. 10-2020-0187164 filed on Dec. 30, 2020 in the Korean Intellectual Property Office, and entitled: "Memory Module, Main Board, and Server Device," is incorporated by reference herein in its entirety.

BACKGROUND

1. Field

Embodiments relate to a memory module, a main board, and a server device.

2. Description of the Related Art

A server device may include a storage, a memory, at least one processor for control thereof, and the like. As capacity of data processed by the server device increases, capacity of the storage and capacity of the memory may also increase.

SUMMARY

Embodiments are directed to a memory module, including: a memory substrate including a main connector and an auxiliary connector, configured to be connected to an external device; and a plurality of memory chips mounted on at least one of a first surface or a second surface of the memory substrate, wherein the main connector is disposed on one side of the memory substrate, and the auxiliary connector is disposed on the second surface of the memory substrate.

Embodiments are directed to a main board, including: a board substrate; a processor socket mounted on the board substrate and connected to a processor; and a plurality of memory module sockets mounted on the board substrate and connected to a memory module, wherein the processor socket is connected to the plurality of memory module sockets by a plurality of memory channels, wherein two or more memory module sockets among the plurality of memory module sockets are allocated to each of the plurality of memory channels, and the board substrate includes at least one board connector disposed between at least a portion of the plurality of memory module sockets, wherein the at least one board connector is connected to at least one of the plurality of memory module sockets by an extension wiring in the board substrate.

Embodiments are directed to a main board, including: a board substrate; a processor socket mounted on the board substrate and connected to a processor; and a plurality of memory module sockets mounted on the board substrate and connected to a memory module, wherein the processor socket is connected to the plurality of memory module sockets by a plurality of memory channels, and each of the plurality of memory channels is connected to one memory module socket among the plurality of memory module sockets, and the board substrate includes an extension space adjacent to a first memory module socket among the plurality of memory module sockets and in which an extension socket provided by a board-to-board (B2B) connector connected to a first memory module coupled to the first memory module socket is mounted.

Embodiments are directed to a server device, including: a main board including at least one processor socket, a plurality of memory module sockets, and a plurality of channel wirings connecting the processor socket with the plurality of memory module sockets and providing a plurality of memory channels; at least one processor coupled to the processor socket; and a plurality of memory modules coupled to at least a portion of the plurality of memory module sockets, wherein one memory channel among the plurality of memory channels is connected to a first memory module and a second memory module, respectively coupled to a first memory module socket and a second memory module socket, wherein the first memory module is connected to the processor by a first channel wiring among the plurality of channel wirings, and the second memory module is connected to the processor by the first channel wiring, the first memory module, and a first board-to-board (B2B) connector coupled to the first memory module.

BRIEF DESCRIPTION OF DRAWINGS

Features will become apparent to those of skill in the art by describing in detail example embodiments with reference to the attached drawings in which.

DETAILED DESCRIPTION

Figure 1:
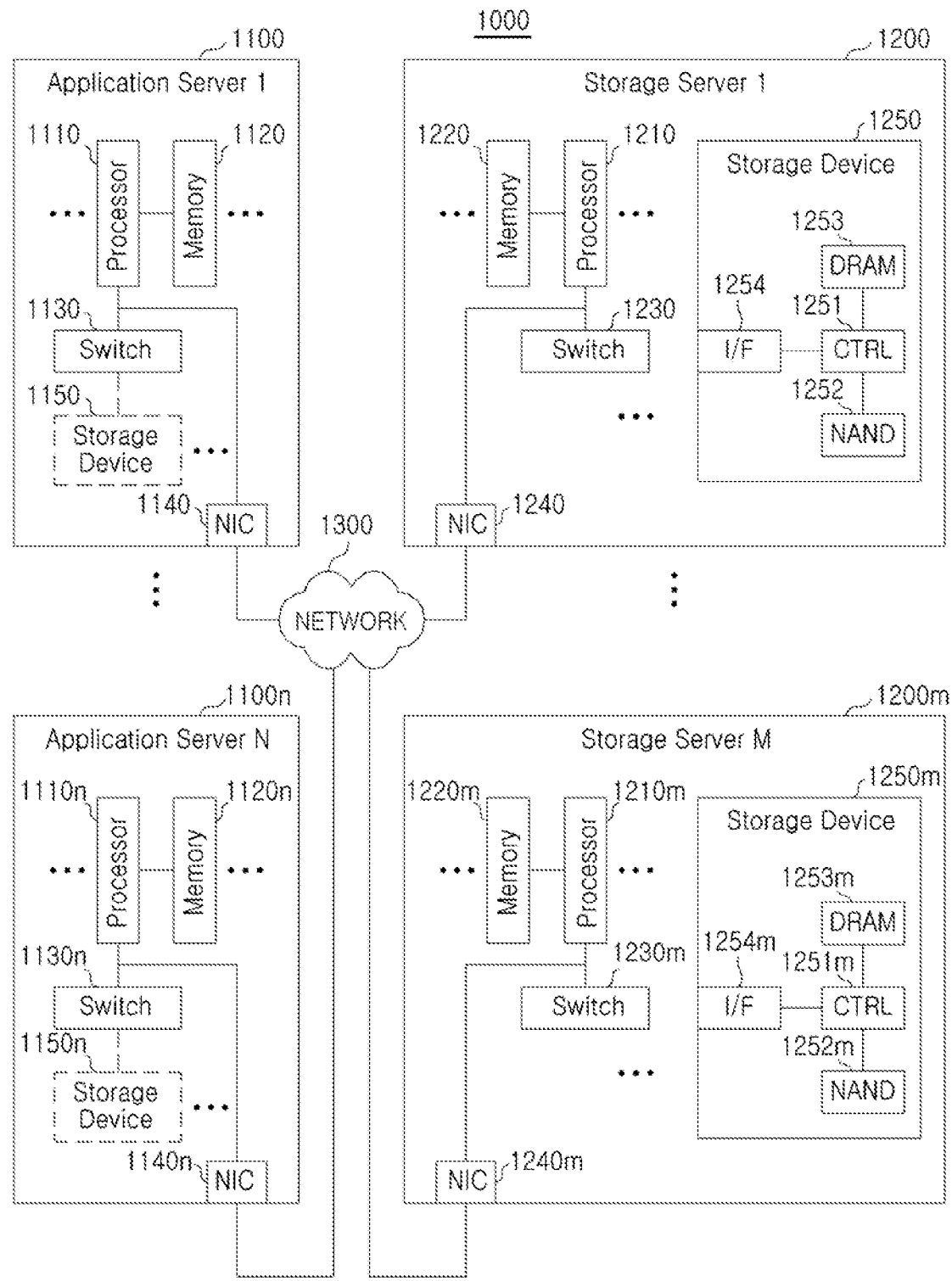
FIG. 1 is a view schematically illustrating a server device according to an example embodiment.

FIG. 1 is a view schematically illustrating a server device according to an example embodiment.

In an example embodiment, referring to FIG. 1, server devices 1100 to 1100n and 1200 to 1200m may configure, e.g., a data center 1000 that may be used for collecting and storing data and providing a service. However, this is merely an example, and the server devices 1100 to 1100n and 1200 to 1200m may be applied to various fields, other than the data center 1000.

The data center 1000 may be a facility that collects various types of data and provides services, and may be referred to as a data storage center. The data center 1000 may be a system for operating a search engine and a database, and may be a computing system used by a company or a government institution. The data center 1000 may include the server devices 1100 to 1100n implemented as application servers 1100 to 1100n, and may include the server devices 1200 to 1200m implemented as storage servers 1200 to 1200m. The number of application servers 1100 to 1100n and the number of storage servers 1200 to 1200m may be varied, and the number of application servers 1100 to 1100n may be different from the number of storage servers 1200 to 1200m.

The application server 1100 and the storage server 1200 may include processors 1110 and 1210 and memories 1120 and 1220, respectively. The storage server 1200 will now be described as an example. The processor 1210 may control all operations of the storage server 1200, access the memory 1220, and execute instructions and/or data loaded in the memory 1220. The memory 1220 may include at least one of a double-data-rate synchronous DRAM (DDR SDRAM), a high-bandwidth memory (HBM), a hybrid memory cube (HMC), a dual in-line memory module (DIMM), Optane DIMM, or a non-volatile DIMM (NVMDIMM).

The number of processors 1210 and the number of memories 1220, included in the storage server 1200, may be varied. For example, one (1) storage server 1200 may include two or more processors 1210. In addition, the number of memories 1220 included in one (1) storage server 1200 and a connection method between the processor 1210 and the memory 1220 may be determined depending on capacity of data to be processed by the storage server 1200, a data processing speed to be supported by the storage server 1200, or the like.

In an example embodiment, the processor 1210 may be connected to the memory 1220 by a memory channel. In order to implement a high-speed operation of rapidly processing data, a plurality of memories 1220 may be distributed and connected to memory channels provided by the processor 1210. When an amount of data to be processed increases, the number of memories 1220 connected to each of the memory channels may increase.

The above description of the storage server 1200 may be similarly applied to the application server 1100. In an example embodiment, the application server 1100 may not include a storage device 1150. The storage server 1200 may include at least one storage device 1250. The number of storage devices 1250 included in the storage server 1200 may be varied.

The application servers 1100 to 1100n may communicate with the storage servers 1200 to 1200m through a network 1300. The network 1300 may be implemented by using a fiber channel (FC), Ethernet, or the like, and may be connected to the servers 1100 to 1100n and 1200 to 1200m by NICs 1140 to 1140n and 1240 to 1240m respectively included in the servers. The NICs 1140 to 1140n and 1240 to 1240m may include a network interface card, a network adapter, or the like.

In an example embodiment, referring to FIG. 1, a storage device 1250 of the storage server 1200 may provide a physical connection between the processor 1210 and a controller 1251, and a physical connection between the NIC 1240 and the controller 1251, by an interface 1254. The interface 1254 may be implemented using a direct attached storage (DAS) scheme in which the storage device 1250 is directly connected with a dedicated cable, or may be implemented by using various interface schemes, such as advanced technology attachment (ATA), serial ATA (SATA), external SATA (e-SATA), small computer small interface (SCSI), serial attached SCSI (SAS), peripheral component interconnection (PCI), PCI express (PCIe), NVM express (NVMe), IEEE 1394, a universal serial bus (USB), a secure digital (SD) card, a multi-media card (MMC), embedded MMC (eMMC), universal flash storage (UFS), an embedded UFS (eUFS), compact flash (CF) card interface, or the like.

The controller 1251 may control all operations of the storage device 1250. In an example embodiment, the controller 1251 may include a static random access memory (SRAM). The controller 1251 may write data to a NAND flash 1252 in response to a program command, or read data from the NAND flash 1252 in response to a read command. For example, the program command and/or the read command may be provided from the processor 1210 of the storage server 1200, the processor 1210m of another storage server 1200m, the processors 1110 and 1110n of the application servers 1100 and 1100n, or the like. DRAM 1253 may temporarily store data to be written to the NAND flash 1252, or data read from the NAND flash 1252. Also, the DRAM 1253 may store metadata. In this case, the metadata may be user data, or data generated by the controller 1251 to manage the NAND flash 1252. The storage device 1250 may include a secure element (SE) for security or privacy.

Figure 2:
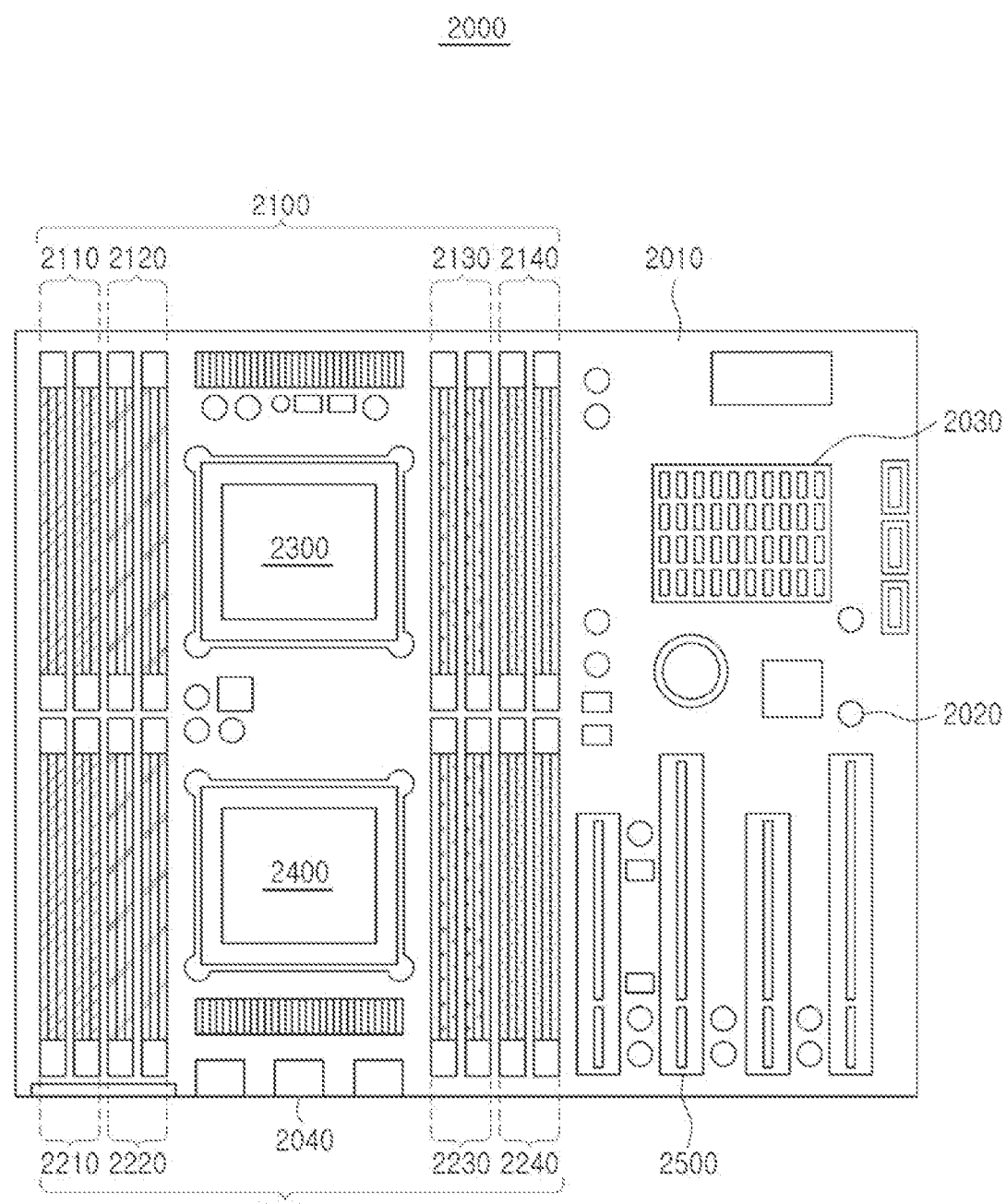
FIGS. 2 and 3 are views schematically illustrating comparative examples of an operation of a server device.
Figure 3:
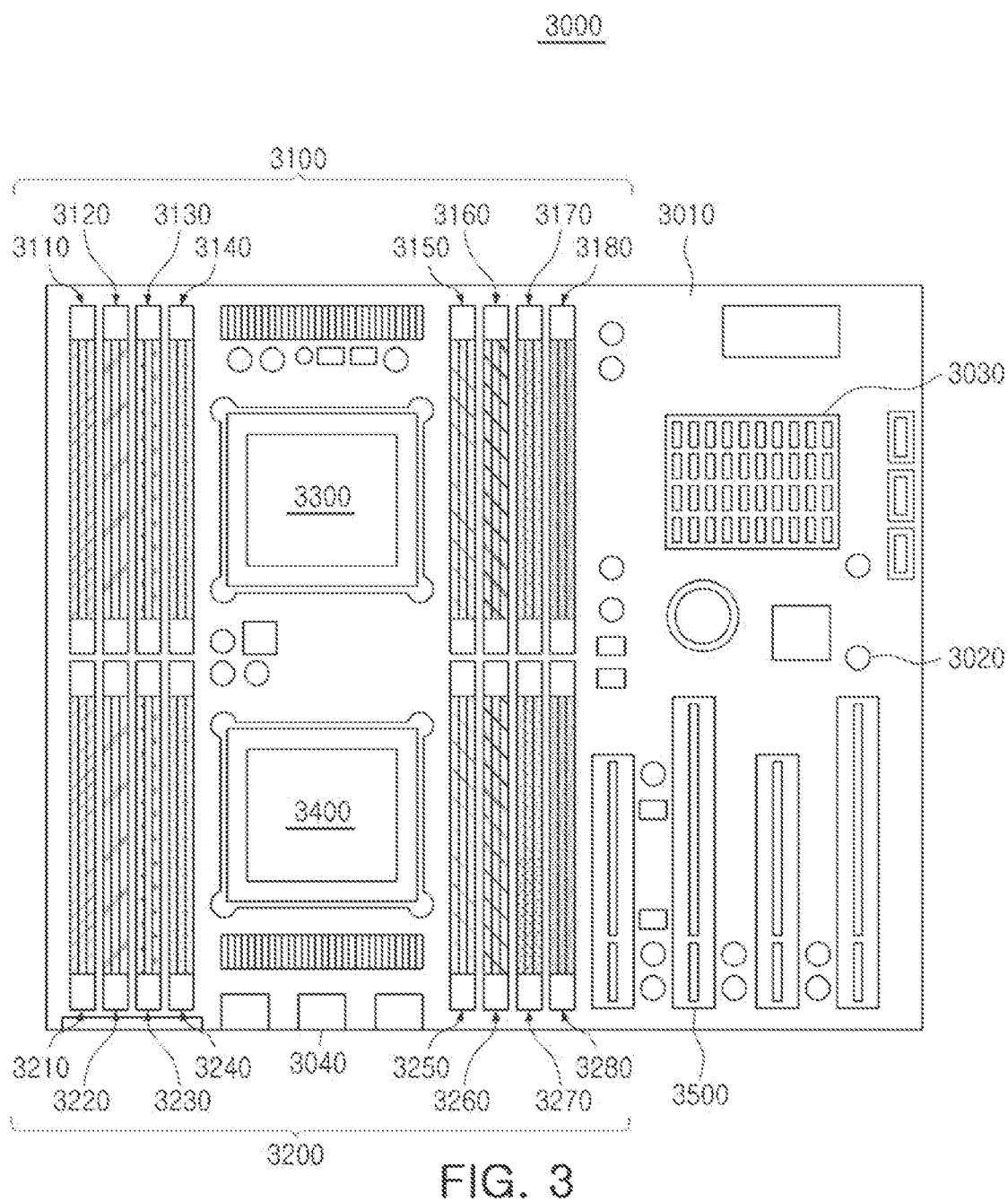

FIGS. 2 and 3 are views schematically illustrating comparative examples of an operation of a server device.

First, referring to FIG. 2, a main board 2000 of a server device according to a comparative example may include a board substrate 2010, and may include passive elements 2020, a heat sink 2030, and an external connector 2040 supporting connection with an external device, formed in the board substrate 2010, and the like.

The main board 2000 may include a plurality of memory module sockets 2100 and 2200 to which memory modules are coupled, a plurality of processor sockets 2300 and 2400 to which processors are coupled, an extension connector 2500 for coupling and connection with other devices, and the like.

In the comparative example illustrated in FIG. 2, the processors mounted in the processor sockets 2300 and 2400 may be connected to the memory module sockets 2100 and 2200 by four memory channels 2110 to 2140 and 2210 to 2240, respectively. In addition, two of each of the memory module sockets 2100 and 2200 may be respectively allocated to the four memory channels 2110 to 2140 and 2210 to 2240, and eight of each of the memory module sockets 2100 and 2200 may be respectively connected to the processor sockets 2300 and 2400. Regardless of whether memory modules are mounted, the eight of each of the memory module sockets 2100 and 2200 may be connected to the processor sockets 2300 and 2400 by the memory channels 2110 to 2140 and 2210 to 2240, respectively. Therefore, due to a load including stub resistance or the like existing in the memory module sockets 2100 and 2200, a channel band stop may occur in a low frequency band, and a data processing speed between the processors and the memory modules may decrease. In order to address this, a main board 3000 may be configured as in the comparative example illustrated in FIG. 3.

The configuration of the main board 3000 according to the comparative example illustrated in FIG. 3 may be similar to the configuration of the main board 2000 described with reference to FIG. 2.

Referring to FIG. 3, processors mounted in processor sockets 3300 and 3400 may be connected to memory module sockets 3100 and 3200 by eight memory channels 3110 to 3180 and 3210 to 3280, respectively. As a result, a load of each of the memory channels 3110 to 3180 and 3210 to 3280 may be reduced to increase a data processing speed and implement a high-speed operation. The number of channel wirings between the processor sockets 3300 and 3400 and the memory channels 3110 to 3180 and 3210 to 3280 may increase, and the number of pins of each of the processors may increase accordingly. Also, when memory modules are coupled to only some of the memory channels, it may be disadvantageous in terms of performance.

In an example embodiment, only one memory module socket is connected to each of the memory channels as a basic socket. The number of memory module sockets and the number of memory modules connected to the memory channels may be increased as needed. Therefore, when a high-speed operation is called for, a memory module may be connected only to the basic socket connected to each of the memory channels, and when memory capacity is to be increased, an extension socket may be connected to the basic socket in each of the memory channels, and a memory module may be coupled to the extension socket.

Figure 4:
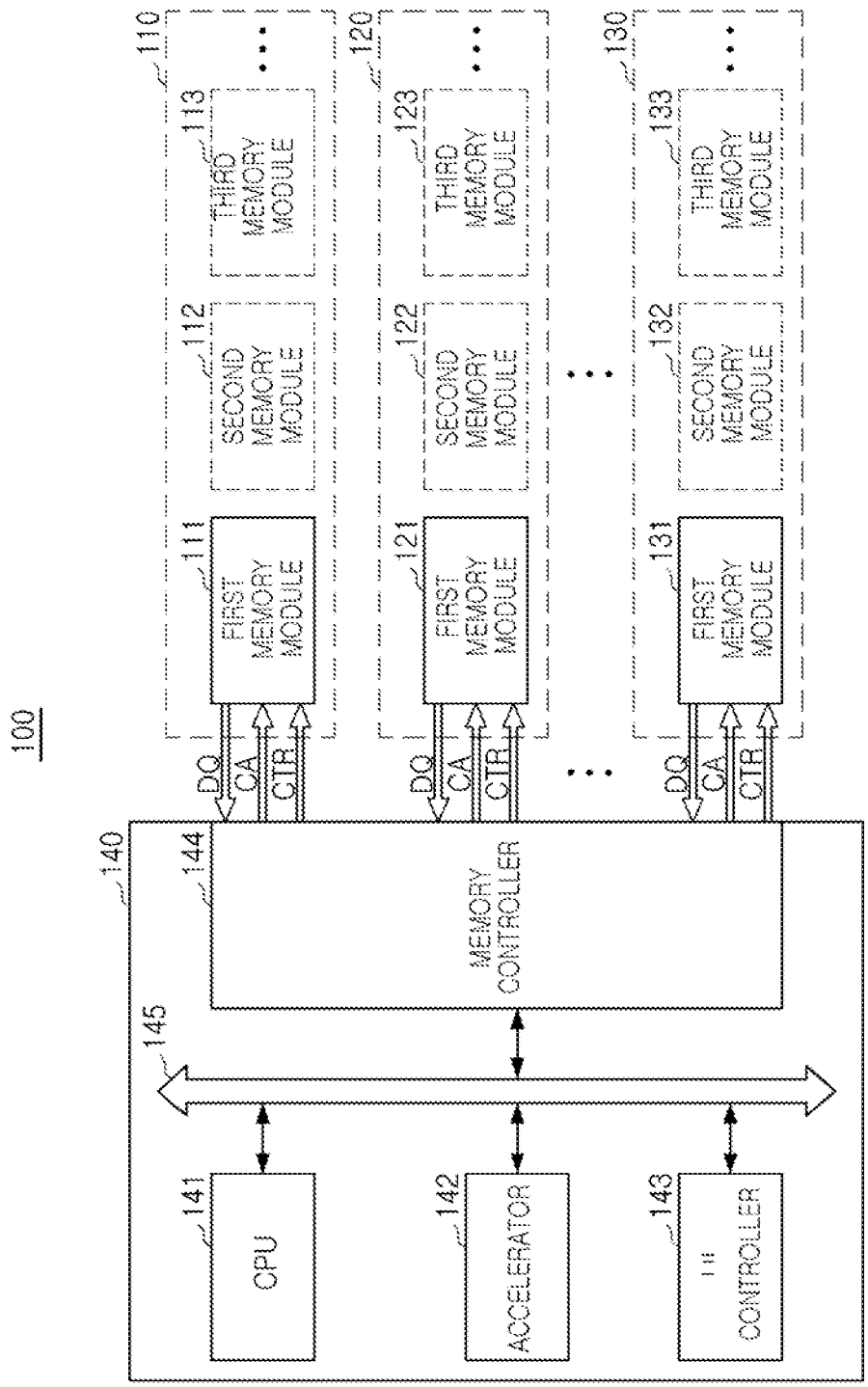
FIG. 4 is a view schematically illustrating a server device according to an example embodiment.

FIG. 4 is a view schematically illustrating a server device according to an example embodiment.

Referring to FIG. 4, a server device 100 according to an example embodiment may include a plurality of memory groups 110 to 130 and a processor 140. The processor 140 may be connected to the memory groups 110 to 130 by a plurality of memory channels. For example, a first memory group 110 may be connected to a first memory channel, a second memory group 120 may be connected to a second memory channel, and a third memory group 130 may be connected to a third memory channel. The processor 140 may output a command/address signal CA, a control signal CTR, and the like through the memory channels, and may exchange data signals DQ with the memory groups 110 to 130.

The processor 140 may include a CPU 141, an accelerator 142, a user interface (UI) controller 143, a memory controller 144, a data bus 145, and the like. The CPU 141 may include at least one core executing an operation for controlling the server device 100. The accelerator 142 may be provided as a separate block for improving a processing speed of multimedia data, and may increase a processing speed of text, audio, image, animation, or the like. The UI controller 143 may control an input/output by a user interface device. As an example, the UI controller 143 may display an input screen such as a keyboard or the like to support an input by a user on a display under control of the CPU 141, and may process input data by the user from the input screen, to send the processed data to the CPU 141.

The memory controller 144 may control the memory groups 110 to 130 through memory channels, and may include a memory interface for transmitting and receiving data. The memory controller 144 may generate a control signal, a command/address signal, or the like, for executing a program operation, a read operation, an erase operation, or the like.

The memory groups 110 to 130 may be configured to include one or more of memory modules 111 to 113, one or more of memory modules 121 to 123, and one or more of memory modules 131 to 133, respectively. The one or more of each of the memory modules 111 to 113, 121 to 123, and 131 to 133 included in each of the memory groups 110 to 130 may be modules physically separated from each other. The number of each of the memory modules 111 to 113, 121 to 123, and 131 to 133 included in each of the memory groups 110 to 130 may be determined depending on an application field of the server device 100, data capacity, and a data processing speed by which the server device 100 processes, or the like. For example, the memory groups 110 to 130 may be configured to include only the first memory modules 111, 121, and 131, respectively, in which case a data processing speed of the server device 100 may increase.

When the memory groups 110 to 130 respectively include only the first memory modules 111, 121, and 131, i.e., only one memory module, memory capacity may be insufficient as data capacity processed by the server device 100 increases. Therefore, in an example embodiment, one memory module socket is provided, to which the first memory modules 111, 121, and 131 are respectively connected (of the memory groups 110 to 130), while the second memory modules 112, 122, and 132 and/or the third memory modules 113, 123, and 133 are added as needed.

For example, in an example embodiment, each of the memory channels corresponding to each of the memory groups 110 to 130 may include only one memory module socket. Therefore, when only the first memory modules 111, 121, and 131 (i.e., only one respective memory module, are connected to each of the memory channels), a load of each of the memory channels may include the stub resistance connected to one memory module socket, whereas a stub resistance of a memory module socket to which a memory module is not actually coupled is not included, in a load of the processor 140. As a result, the first memory modules 111, 121, and 131 may be coupled to one memory module socket provided for each of the memory channels, to implement a high data processing speed.

In addition, as necessary, a memory module socket may be added to each of the memory channels and a memory module may be coupled to the added memory module socket, to expand memory capacity. Therefore, the server device 100 may be implemented to be flexibly operated according to various situations and environments.

Figure 5:
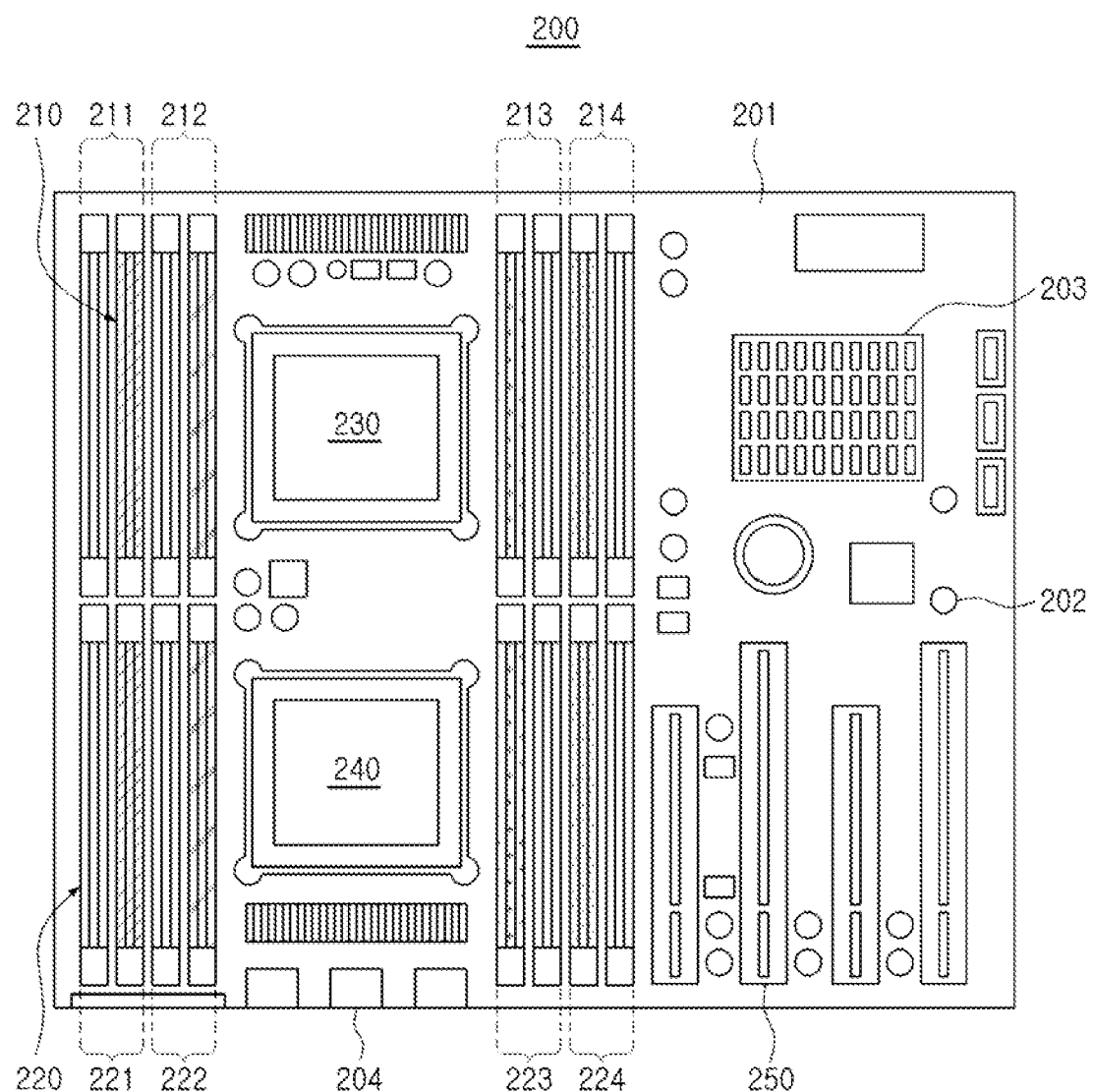
FIGS. 5 and 6 are views schematically illustrating a main board included in a server device according to an example embodiment.
Figure 6:
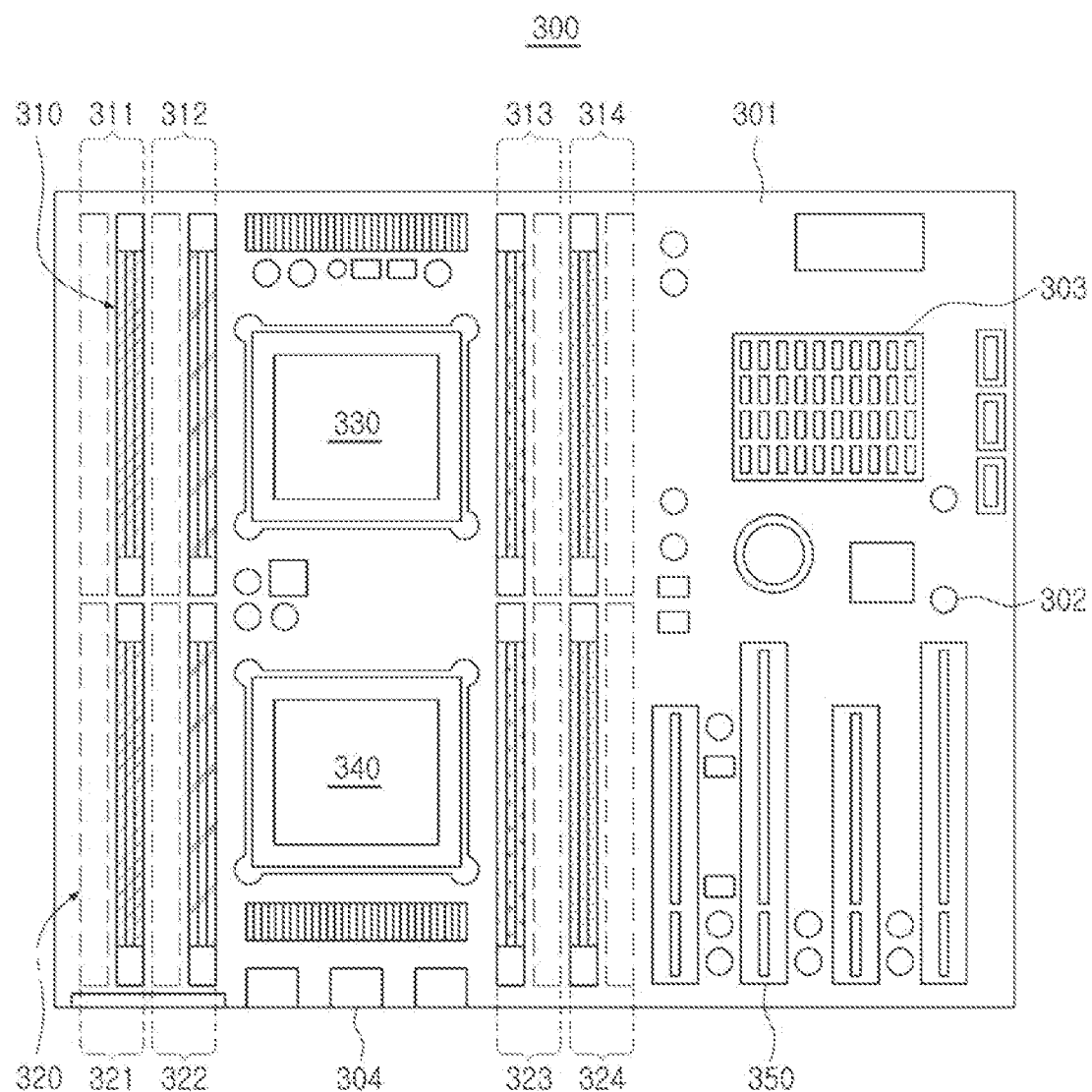

FIGS. 5 and 6 are views schematically illustrating a main board included in a server device according to an example embodiment.

First, referring to FIG. 5, a main board 200 according to an example embodiment may include a board substrate 201, and may include passive elements 202, a heat sink 203, and an external connector 204 supporting connection with an external device, formed in the board substrate 201, and the like. The main board 200 may include a plurality of memory module sockets 210 and 220 to which memory modules are coupled, a plurality of processor sockets 230 and 240 to which processors are coupled, an extension connector 250 for coupling and connection with other devices, and the like. For example, the extension connector 250 may provide connection with other devices according to various standards such as PCI-Express, SATA, and the like.

The processor sockets 230 and 240 may be connected to the memory module sockets 210 and 220 by a plurality of memory channels 211 to 214 and 221 to 224, respectively, and the board substrate 201 may include channel wirings for providing the plurality of memory channels 211 to 214 and 221 to 224. In an example embodiment, referring to FIG. 5, it is assumed that each of the processor sockets 230 and 240 is connected to the memory module sockets 210 and 220 by four memory channels 211 to 214 and 221 to 224, respectively, but is only illustrative.

Referring to FIG. 5, the memory module sockets 210 and 220 in each of the memory channels may be divided into a basic memory module socket 210 and an extension memory module socket 220. The basic memory module socket 210 may be connected to one of the processor sockets 230 and 240 by a channel wiring in the board substrate 201. On the other hand, the extension memory module socket 220 may be connected to an extension wiring in the board substrate 201, and may be separated from the channel wiring and the basic memory module socket 210. For example, the extension memory module socket 220 may not be directly connected to the channel wiring and the processor sockets 230 and 240 in the board substrate 201. Therefore, when a memory module is connected only to the basic memory module socket 210, a load of each of the memory channels 211 to 214 and 221 to 224 may be reduced, and a high-speed operation may be implemented.

The extension memory module socket 220 may be selectively connected to a channel wiring when data processing capacity increases. For example, the extension memory module socket 220 may be connected to the basic memory module socket 210, by a memory module coupled to the basic memory module socket 210, and a board-to-board (B2B) connector coupled to the memory module. A memory module coupled to the extension memory module socket 220 may exchange a data signal and a command/address signal with a processor through a memory module coupled to the basic memory module socket 210. To this end, the memory module coupled to the basic memory module socket 210 may include at least one memory buffer chip.

A main board 300 according to an example embodiment illustrated in FIG. 6 may have a configuration similar to a configuration of the main board 200 according to the example embodiment described with reference to FIG. 5. The main board 300 may include a board substrate 301, passive elements 302, a heat sink 303, an external connector 304, a plurality of memory module sockets 310, an extension space 320, a plurality of processor sockets 330 and 340, an extension connector 350, and the like.

In an example embodiment, referring to FIG. 6, each of the processor sockets 330 and 340 may be connected to the memory module sockets 310 by a plurality of memory channels. Each of the processor sockets 330 and 340 is illustrated to be connected to the memory module sockets 310 by four memory channels 311 to 314 and 321 to 324, as an example.

Referring to FIG. 6, the extension space 320 may be provided to be adjacent to the memory module sockets 310 connected to each of the memory channels 311 to 314 and 321 to 324. The extension space 320 may be a space in which an extension socket may be mounted, as desired. Therefore, in a state in which an extension socket is not mounted in the extension space 320, since each of the memory channels 311 to 314 and 321 to 324 includes only one memory module socket 310, loads of the memory channels 311 to 314 and 321 to 324 may be reduced, and a high-speed operation may be implemented.

When expansion of memory capacity is desired, an extension socket may be mounted in the extension space 320. For example, a memory module capable of being coupled to a B2B connector may be mounted in the memory module socket 310, the B2B connector integrally configured with an extension socket may be coupled to the memory module, and the extension socket may be mounted in the extension space 320. In this case, one side of the B2B connector may include a plurality of pins capable of being coupled to the memory module, and the other side of the B2B connector may be integrally coupled to the extension socket. According to an example embodiment, one B2B connector may be integrally configured with two or more extension sockets.

Similar to the description with reference to FIG. 5, a memory module coupled to an extension socket may send/receive a data signal and a command/address signal to/from a processor through a memory module coupled to the memory module socket 310 basically provided by the main board 300. To this end, the memory module coupled to the memory module socket 310 may include at least one memory buffer chip.

Figure 7:
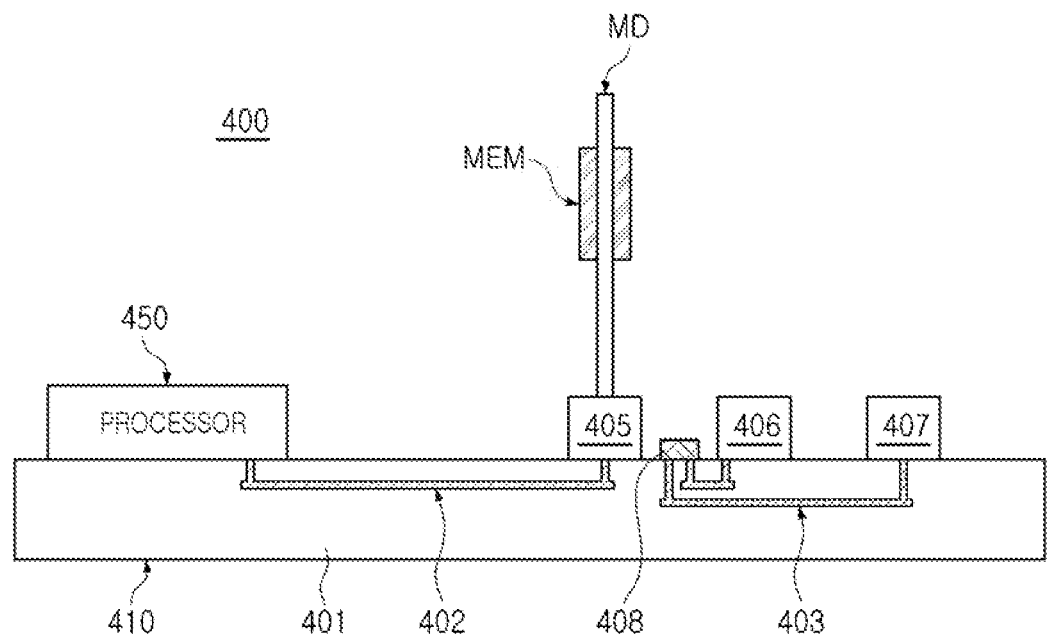
FIGS. 7 and 8 are views illustrating configurations of a main board and a memory module in a server device according to an example embodiment.
Figure 8:
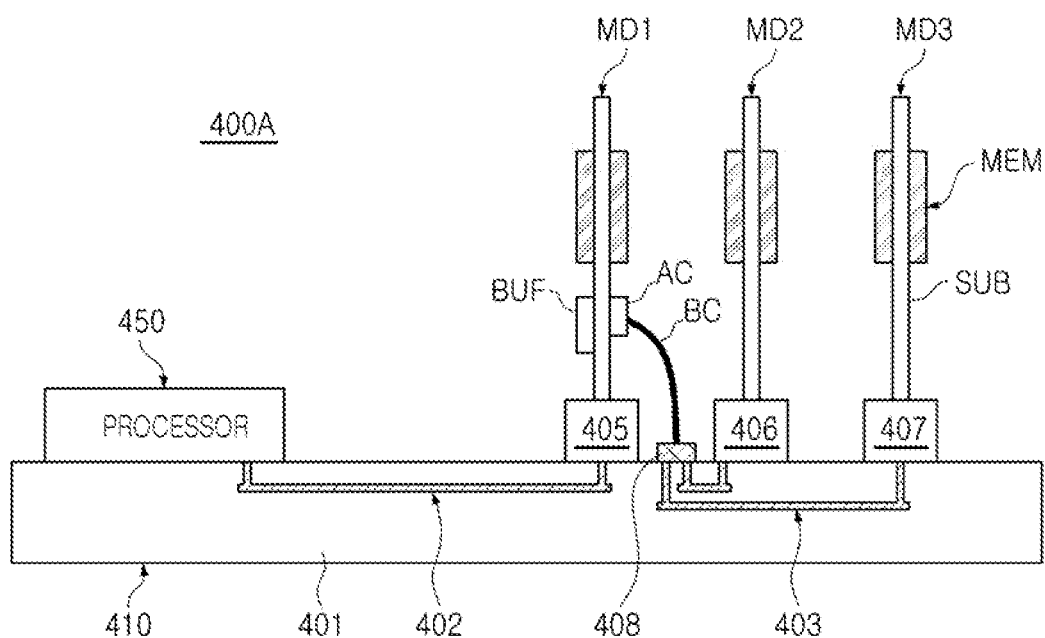

FIGS. 7 and 8 are views illustrating configurations of a main board and a memory module in a server device according to an example embodiment.

Referring to FIGS. 7 and 8, a server device 400 may include a main board 410, a processor 450 and a memory module MD, mounted on the main board 410, and the like. The main board 410 may include a board substrate 401, a plurality of wirings 402 and 403 formed in the board substrate 401, a plurality of memory module sockets 405 to 407, a board connector 408, and the like. In an example embodiment, referring to FIG. 7, the memory module sockets 405 to 407 may share one memory channel.

The memory module MD may be coupled to at least one of the plurality of memory module sockets 405 to 407, and the memory module MD may include a memory substrate SUB and a plurality of memory chips MEM. In an example embodiment, referring to FIG. 7, it is illustrated that the memory chips MEM are mounted on both first and second surfaces of the memory substrate SUB. Unlike this, memory chips MEM may be mounted on only one of the first and second surfaces.

The plurality of wirings 402 and 403 may include a channel wiring 402 (for connecting a processor socket on which the processor 450 is mounted and a first memory module socket 405 provided as a basic socket, among the plurality of memory module sockets 405 to 407) and an extension wiring 403 (for connecting the board connector 408 to second and third memory module sockets 406 and 407 provided as extension sockets). In an example embodiment, referring to FIG. 7, each of the memory module sockets 405 to 407 may be provided integrally with the board substrate 401. Referring to FIG. 7, when only one memory module MD is mounted on the main board 410, the second and third memory module sockets 406 and 407 may be separated from the first memory module socket 405, and the first memory module socket 405 and the memory module MD may be connected to the processor 450 by the channel wiring 402.

In an example embodiment, referring to FIG. 7, since only the first memory module socket 405 is connected to the processor 450, a load between the processor 450 and the memory module MD may be relatively small. Therefore, a high-speed operation may be implemented by increasing a data processing speed between the processor 450 and the memory module MD.

Next, referring to FIG. 8, a server device 400A may be implemented to have expanded memory capacity, compared to the server device 400 described with reference to FIG. 7. In a server device 400A according to an example embodiment illustrated in FIG. 8, a plurality of memory modules MD1 to MD3 may be coupled to a plurality of memory module sockets 405 to 407. At least some of the plurality of memory modules MD1 to MD3 may have different structures.

For example, a first memory module MD1 coupled to a first memory module socket 405 may include a memory substrate SUB, memory chips MEM and a memory buffer chip BUF, mounted on the memory substrate SUB, an auxiliary connector AC, and the like. The memory chips MEM may be mounted on at least one of first and second surfaces of the memory substrate SUB, the memory buffer chip BUF may be mounted on the first surface of the memory substrate SUB, and the auxiliary connector AC may be disposed on the second surface of the memory substrate SUB. This is only illustrative, and an arrangement and/or the number of the memory chips MEM, the memory buffer chip BUF, and the auxiliary connector AC may be variously changed.

The auxiliary connector AC of the first memory module MD1 may be connected to a board connector 408 by a B2B connector BC. Since the board connector 408 may be connected to second and third memory module sockets 406 and 407 by extension wirings 403, a second memory module MD2 and a third memory module MD3 may exchange a control signal, a data signal, a command/address signal, and the like, generated by the processor 450, with the processor 450, through the auxiliary connector AC, the B2B connector BC, and the board connector 408.

For example, a data signal and a command/address signal generated by the processor 450 may be transmitted to at least one of the second memory module MD2 and the third memory module MD3 through the memory buffer chip BUF. Since the first memory module MD1, and the second memory module MD2 and the third memory module MD3 exist as separate modules physically separated from each other, the memory buffer chip BUF may be connected to the second and third memory modules MD2 and MD3 externally, not the first memory module MD1, through the B2B connector BC. In addition, read data output from the second memory module MD2 and the third memory module MD3 in response to a read command of the processor 450 may be transmitted to the processor 450 through the memory buffer chip BUF.

Unlike the first memory module MD1, the second memory module MD2 and the third memory module MD3 coupled to the second and third memory module sockets 406 and 407 may not include a memory buffer chip BUF and an auxiliary connector AC. Therefore, a memory module MD according to the example embodiment described with reference to FIG. 7 may be used as the second memory module MD2 or the third memory module MD3. Also, since only the first memory module MD1 may be selected as a module including a memory buffer chip BUF and an auxiliary connector AC, and the second memory module MD2 and the third memory module MD3 may be selected as relatively inexpensive modules, costs to expand memory capacity may be reduced.

In the example embodiment described with reference to FIG. 8, the memory buffer chip BUF of the first memory module MD1 may transmit a command/address signal and a data signal received from the processor 450 to the second memory module MD2 and the third memory module MD3. Therefore, the memory buffer chip BUF may be implemented as a multiple input/output buffer.

Figure 9:
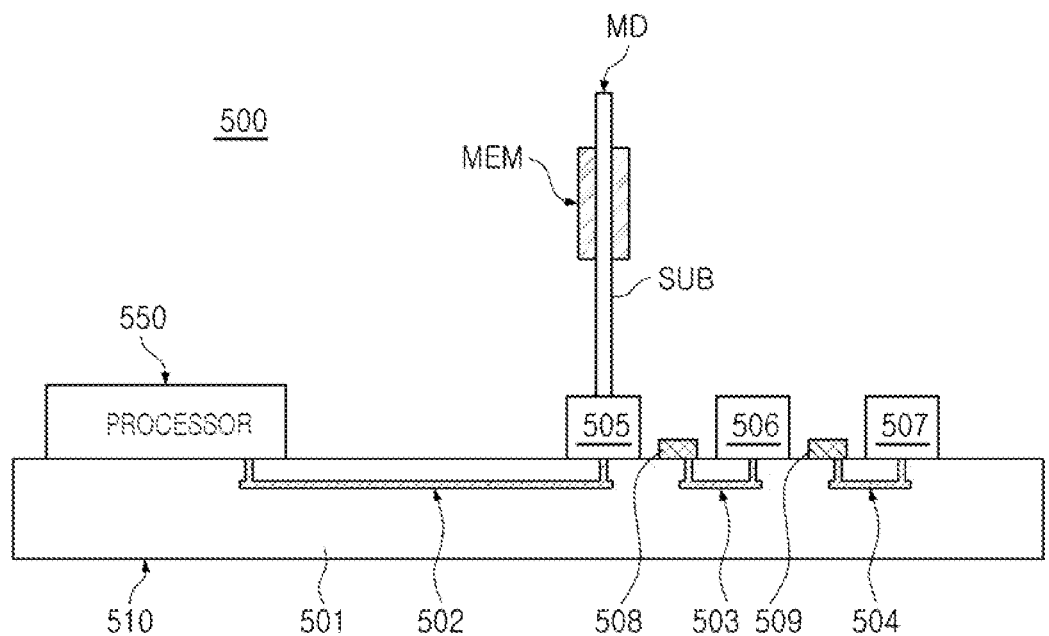
FIGS. 9 to 11 are views illustrating configurations of a main board and a memory module in a server device according to an example embodiment.
Figure 10:
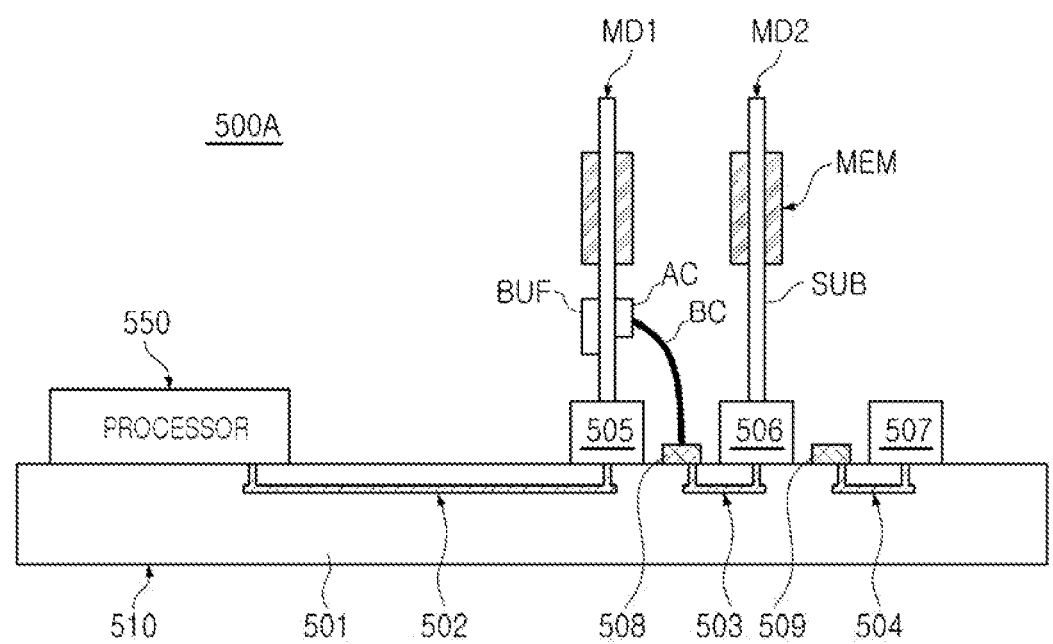
Figure 11:
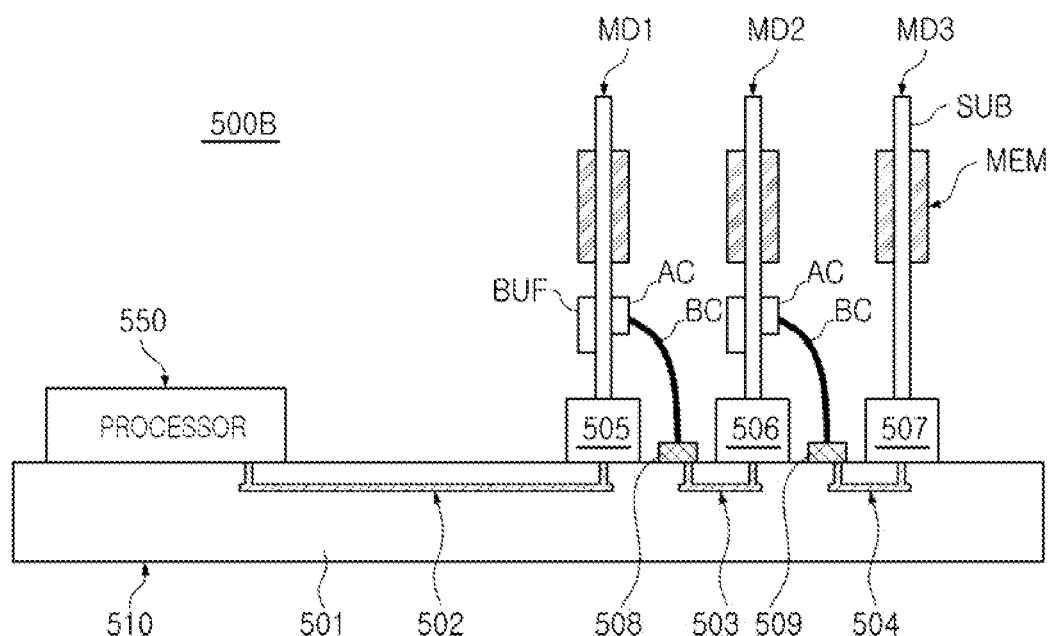

FIGS. 9 to 11 are views illustrating configurations of a main board and a memory module in a server device according to an example embodiment.

First, referring to FIG. 9, a server device 500 according to an example embodiment may include a main board 510, a processor 550 and a memory module MD, mounted on the main board 510, and the like. The main board 510 may include a board substrate 501, a plurality of wirings 502 to 504 formed in the board substrate 501, a plurality of memory module sockets 505 to 507, board connectors 508 and 509, and the like. The plurality of memory module sockets 505 to 507 may share one memory channel.

The plurality of wirings 502 to 504 may include a channel wiring 502 and extension wirings 503 and 504. Among the extension wirings 503 and 504, a first extension wiring 503 may be connected to a first board connector 508, and a second extension wiring 504 may be connected to a second board connector 509.

In an example embodiment, referring to FIG. 9, a configuration of the server device 500 may be similar to that described with reference to FIG. 7. The memory module MD may be coupled only to a first memory module socket 505 provided as a basic socket, and the processor 550 may be connected only to the first memory module socket 505 by the channel wiring 502. The extension wirings 503 and 504 and second and third memory module sockets 506 and 507 may not be connected to the channel wiring 502 and the processor 550. Therefore, a load between the processor 550 and the memory module MD may be decreased, and a data processing speed may be increased.

In an example embodiment, referring to FIG. 10, a server device 500A may be implemented to have expanded memory capacity, compared to the embodiment illustrated in FIG. 9. Referring to FIG. 10, a plurality of memory modules MD1 and MD2 having different structures may be connected to a main board 510. For example, a first memory module MD1 coupled to a first memory module socket 505, which may be a basic socket, may include a memory substrate SUB, memory chips MEM and a memory buffer chip BUF, mounted on the memory substrate SUB, and an auxiliary connector AC. A second memory module MD2 coupled to a second memory module socket 506 provided as a first extension socket may include a memory substrate SUB and memory chips MEM mounted on the memory substrate SUB. Therefore, since a memory module MD coupled to a first memory module socket 505 in an embodiment illustrated in FIG. 9 may be used as the second memory module MD2 by transferring and inserting the memory module MD coupled to the first memory module socket 505 as it is, costs to expand memory capacity may be reduced.

The second memory module MD2 may receive a command/address signal or the like generated by a processor 550 through the first memory module MD1. Also, the second memory module MD2 may exchange a data signal with the processor 550 through the first memory module MD1. For example, the memory buffer chip BUF may buffer a data signal and/or a command/address signal received from the processor 550 and transmit the buffered data to the second memory module MD2. The memory buffer chip BUF may exchange a signal with the second memory module MD2 through a B2B connector BC.

Next, referring to FIG. 11, a server device 500B may be implemented to have expanded memory capacity, compared to the embodiment illustrated in FIG. 9. Referring to FIG. 11, a plurality of memory modules MD1 to MD3 may be connected to a main board 510. A first memory module MD1 coupled to a first memory module socket 505 may have the same configuration as described with reference to FIG. 10.

In an example embodiment, referring to FIG. 11, a second memory module MD2 and a third memory module MD3 may be connected to a second memory module socket 506 and a third memory module socket 507, respectively. The second memory module MD2 may have the same structure as the first memory module MD1. The third memory module MD3 may have the same structure as the memory module MD according to the example embodiment described with reference to FIG. 9. Therefore, a memory module MD coupled to a first memory module socket 505 in an embodiment illustrated in FIG. 9 may be used as the third memory module MD3 by transferring and inserting the memory module MD coupled to the first memory module socket 505 as it is, costs to expand memory capacity may be reduced.

The second memory module MD2 may exchange a signal with a processor 550 through the first memory module MD1. Also, the third memory module MD3 may exchange a signal with the processor 550 through the second memory module MD2 and the first memory module MD1. As a result, the third memory module MD3 may be connected to the processor 550 by a channel wiring 502, the first memory module MD1, the second memory module MD2, extension wirings 503 and 504, and B2B connectors BC.

In order to support the connection between the processor 550 and the third memory module MD3, the first memory module MD1 may be connected to a first board connector 508 and a first extension wiring 503 by a B2B connector BC. The second memory module MD2 may be connected, and the second memory module MD2 may be connected to a second board connector 509 and a second extension wiring 504 by a B2B connector BC. Each of the first and second memory modules MD1 and MD2 may include a memory buffer chip BUF that buffers a signal.

For example, in example embodiments described with reference to FIGS. 10 and 11, the plurality of memory modules MD1 to MD3 may be connected in series to each other, and may operate in a re-driving method. In example embodiments described with reference to FIGS. 10 and 11, each of the second memory module MD2 and the third memory module MD3 may directly receive at least some signals from the processor 550 or the main board 510. For example, each of the second memory module MD2 and the third memory module MD3 may directly receive a reference voltage used for an operation from the processor 550 or the main board 510.

Figure 12:
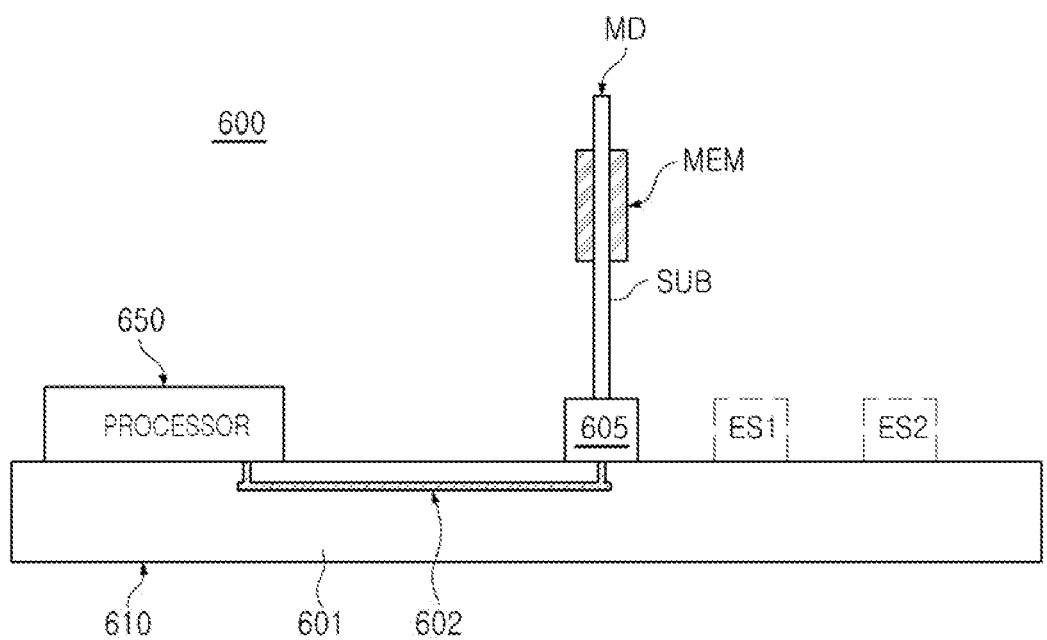
FIGS. 12 to 14 are views illustrating configurations of a main board and a memory module in a server device according to an example embodiment.
Figure 13:
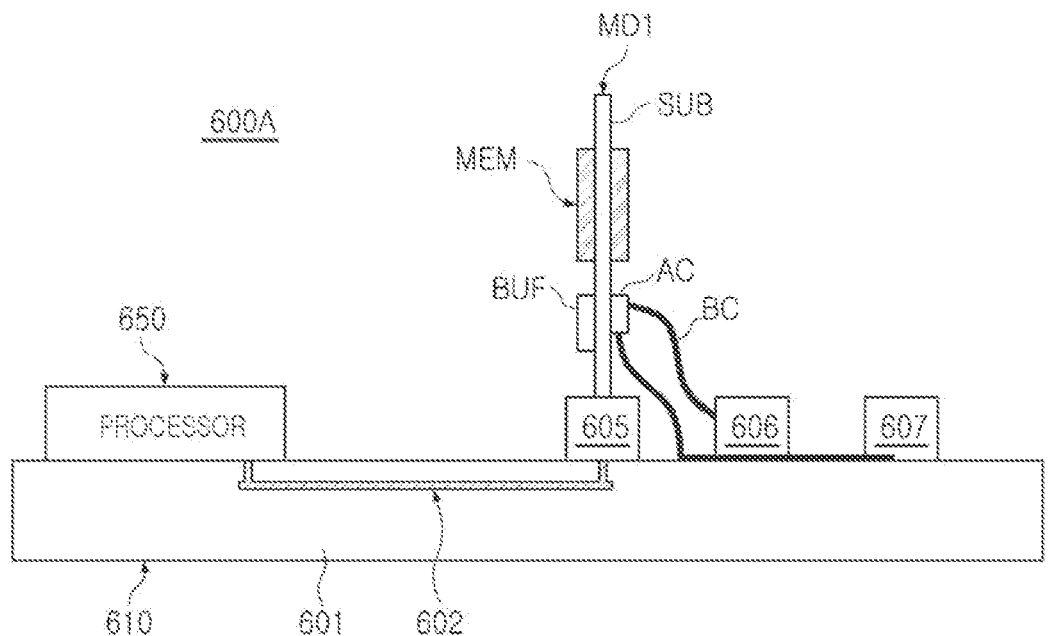
Figure 14:
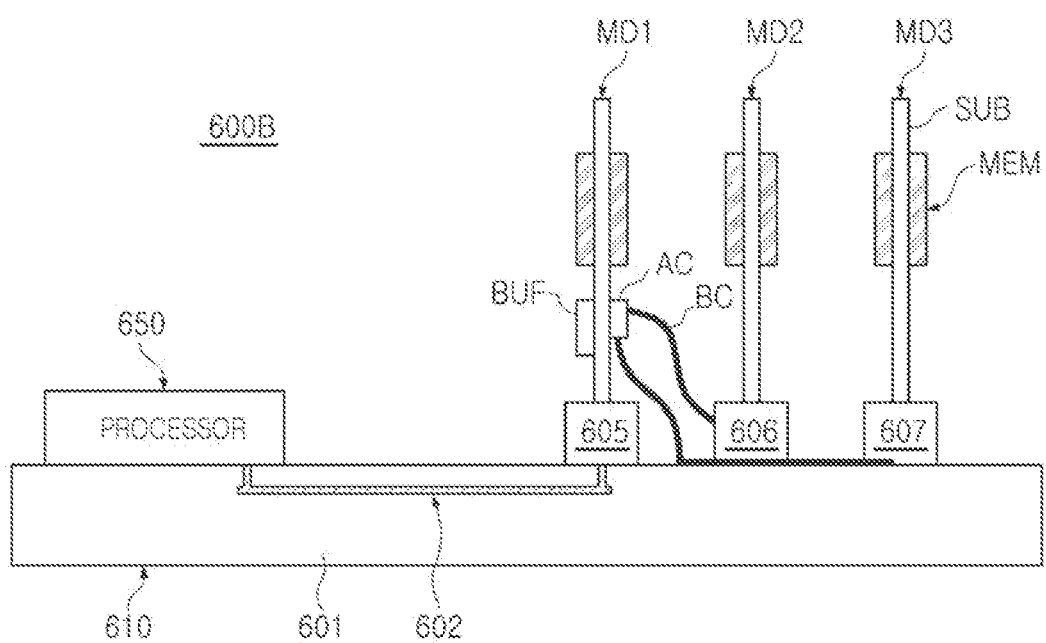

FIGS. 12 to 14 are views illustrating configurations of a main board and a memory module in a server device according to an example embodiment.

First, referring to FIG. 12, a server device 600 according to an example embodiment may include a main board 610, a processor 650 and a memory module MD, mounted on the main board 610, and the like. The main board 610 may include a board substrate 601, a channel wiring 602 formed in the board substrate 601, a memory module socket 605, and the like.

In an example embodiment, referring to FIG. 12, the main board 610 may include only the memory module socket 605 provided as a basic socket for one memory channel. For example, only the memory module socket 605, provided as a basic socket, may be provided integrally with the board substrate 601.

The main board 610 may provide extension spaces ES1 and ES2, adjacent to the memory module socket 605. The extension spaces ES1 and ES2 may be spaces in which an extension socket may be mounted to add a memory module, when expansion of memory capacity is called for. Hereinafter, a method of installing the extension socket in the extension spaces ES1 and ES2 and expanding the memory capacity will be described in detail, with reference to FIGS. 13 and 14.

Referring to FIG. 13, extension sockets may be installed to expand memory capacity of a server device 600A. The extension sockets may include second and third memory module sockets 606 and 607, and the second and third memory module sockets 606 and 607 may be provided integrally with B2B connectors BC. For example, one side of each of the B2B connectors BC may include a plurality of connector pins connectable to an auxiliary connector AC of a first memory module MD1, and the second and third memory module sockets 606 and 607, provided as extension sockets, may be integrally connected to the other side of each of the B2B connectors BC.

The second and third memory module sockets 606 and 607 may be coupled to a board substrate 601 of a main board 610 in various ways. For example, each of the second and third memory module sockets 606 and 607 may include a fastening portion for coupling with the board substrate 601 with screws or the like, or may be coupled to the board substrate 601 by a method such as soldering or the like. Therefore, according to an example embodiment, the second and third memory module sockets 606 and 607 may be coupled to the board substrate 601, to be separated from each other as needed.

A first memory module socket 605 may be coupled to the first memory module MD1, which may be different from the memory module MD described above with reference to FIG. 12. The first memory module MD1 may include a memory substrate SUB, memory chips MEM, at least one memory buffer chip BUF, and an auxiliary connector AC. For example, the memory buffer chip BUF may be mounted on a first surface of the memory board SUB, the auxiliary connector AC may be disposed on a second surface of the memory board SUB, and the second surface may be a surface closer to spaces ES1 and ES2, as compared to the first surface. The second and third memory module sockets 606 and 607 may be added as extension sockets by the B2B connectors BC coupled to the auxiliary connector AC.

Referring to FIG. 14, second and third memory modules MD2 and MD3 may be coupled to second and third memory module sockets 606 and 607, respectively. Therefore, a server device 600B having expanded memory capacity may be implemented. Unlike a first memory module MD1, the second and third memory modules MD2 and MD3 may not include a memory buffer chip BUF and an auxiliary connector AC. In an example embodiment, one of the second and third memory modules MD2 and MD3 may be a memory module MD according to the example embodiment described with reference to FIG. 12.

The second and third memory modules MD2 and MD3 may be connected in parallel to each other, and may exchange a signal with a processor 650 through the first memory module MD1. For example, a data signal, a command/address signal, a control signal, or the like, generated by the processor 650, may be transmitted to the second and third memory modules MD2 and MD3 through the first memory module MD1. In an example embodiment, the command/address signal and the data signal may be transmitted to at least one of the second and third memory modules MD2 and MD3 through a memory buffer chip BUF.

Figure 15:
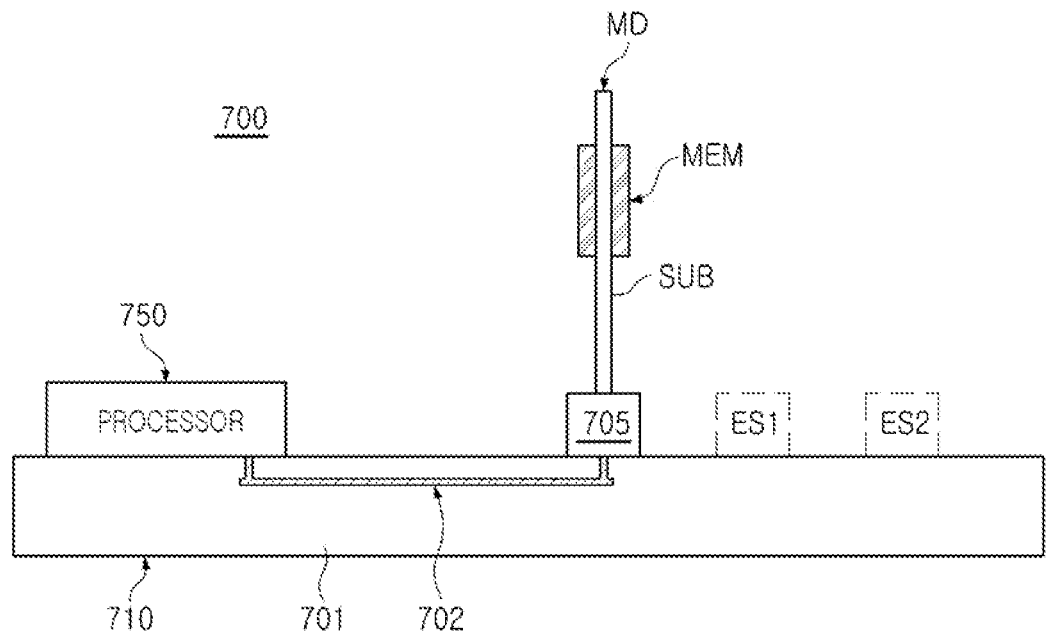
FIGS. 15 to 17 are views illustrating configurations of a main board and a memory module in a server device according to an example embodiment.
Figure 16:
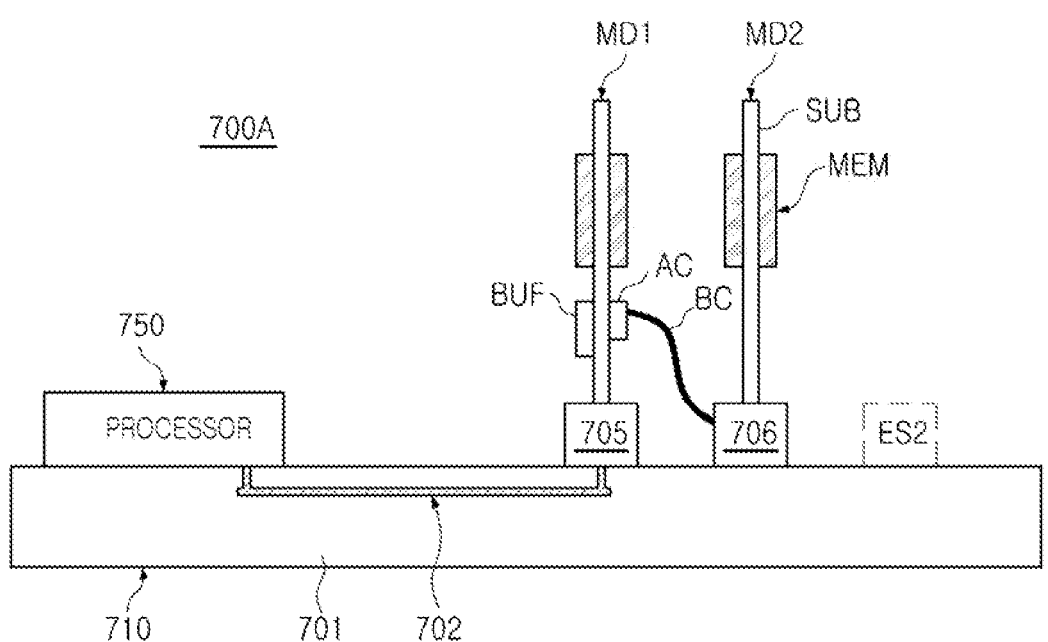
Figure 17:
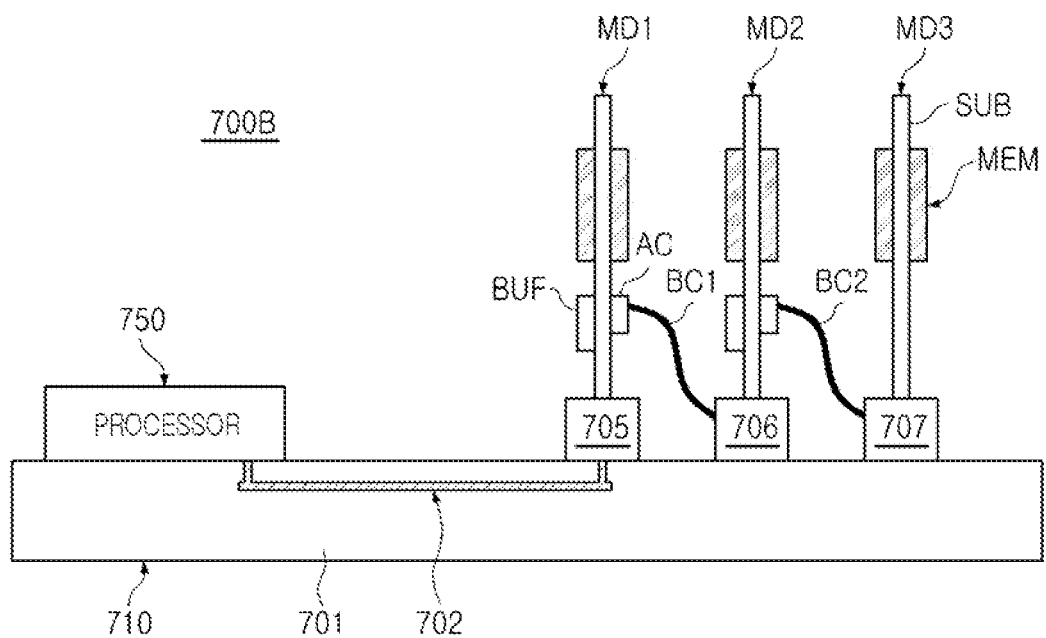

FIGS. 15 to 17 are views illustrating configurations of a main board and a memory module in a server device according to an example embodiment.

First, referring to FIG. 15, a server device 700 according to an example embodiment may include a main board 710, a processor 750 and a memory module MD, mounted on the main board 710, and the like. The main board 710 may include a board substrate 701, a channel wiring 702 formed in the board substrate 701, a memory module socket 705, and the like. Similarly to that described with reference to FIG. 12 above, the main board 710 may include only the memory module socket 705 provided as a basic socket for one memory channel, and extension spaces ES1 and ES2, adjacent to the memory module socket 705, may be provided.

Referring to FIG. 16, a first extension socket may be installed to expand memory capacity of a server device 700A. The first extension socket may be provided by a second memory module socket 706, and the second memory module socket 706 may be provided integrally with a B2B connector BC. One side of the B2B connector BC may include a plurality of connector pins connectable to an auxiliary connector AC of a first memory module MD1, and an extension socket provided as the second memory module socket 706 may be integrally connected to the other side of the B2B connector BC. As described above with reference to FIGS. 13 and 14, the second memory module socket 706 may be coupled to a board substrate 701 in various ways.

The first memory module MD1 (having a configuration different from that of the memory module MD described with reference to FIG. 15) may be coupled to the first memory module socket 705. The first memory module MD1 may further include at least one memory buffer chip BUF and an auxiliary connector AC, in addition to a memory substrate SUB and memory chips MEM. The memory buffer chip BUF may mediate signal transmission/reception between a second memory module MD2 coupled to a second memory module socket 706 and a processor 750. The auxiliary connector AC may be coupled to the B2B connector BC. The second memory module MD2 according to an example embodiment illustrated in FIG. 16 may utilize the memory module MD according to the example embodiment described with reference to FIG. 15 as it is.

Next, as illustrated in FIG. 17, in order to further expand memory capacity of a server device 700B, a second extension socket 707 may be further installed in addition to a first extension memory module socket 706. Referring to FIG. 17, first to third memory modules MD1 to MD3 may be coupled to first to third memory module sockets 705 to 707, respectively. For example, the third memory module MD3 may utilize the memory module MD according to the example embodiment described with reference to FIG. 15 as it is.

The second memory module MD2 may exchange a signal with a processor 750 through the first memory module MD1, and the third memory module MD3 may exchange a signal with the processor 750 through the second memory module MD2 and the first memory module MD1. To this end, the first memory module MD1 may be connected to the second memory module socket 706 and the second memory module MD2 by a B2B connector BC1, and the second memory module MD2 may be connected to the third memory module socket 707 and the third memory module MD3 by a B2B connector BC2. Each of the first and second memory modules MD1 and MD2 may include a memory buffer chip BUF that buffers signals.

In an example embodiment, referring to FIG. 17, the first to third memory modules MD1 to MD3 may be connected in series to each other, and may operate in a re-driving manner. As previously described with reference to FIGS. 10 and 11, each of the second memory module MD2 and the third memory module MD3 may also directly receive at least some signals such as a reference voltage or the like from the processor 750 or a main board 710.

Figure 18A:
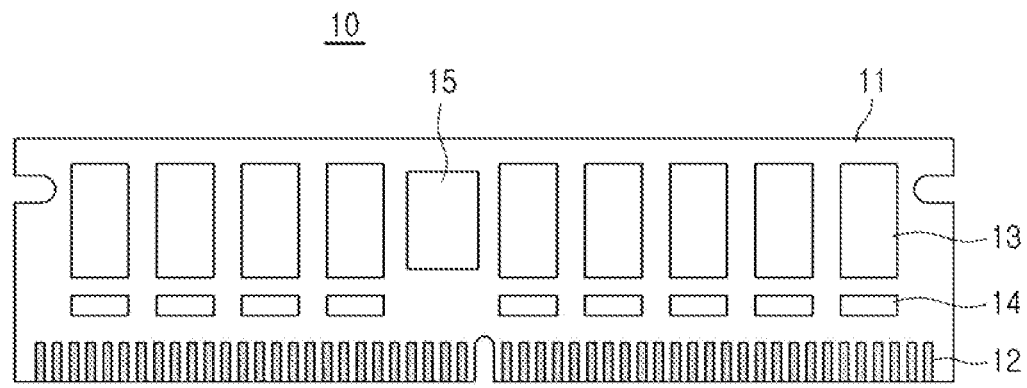
FIGS. 18A and 18B, and 19A and 19B are views illustrating memory modules according to example embodiments.
Figure 18B:
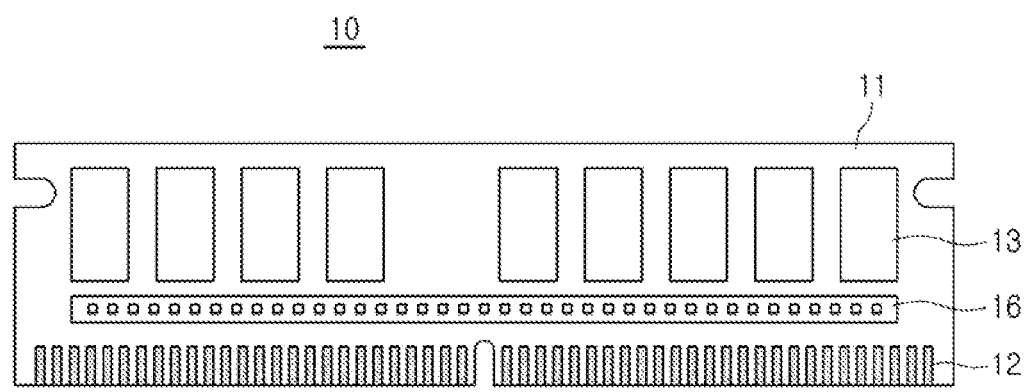
Figure 19A:
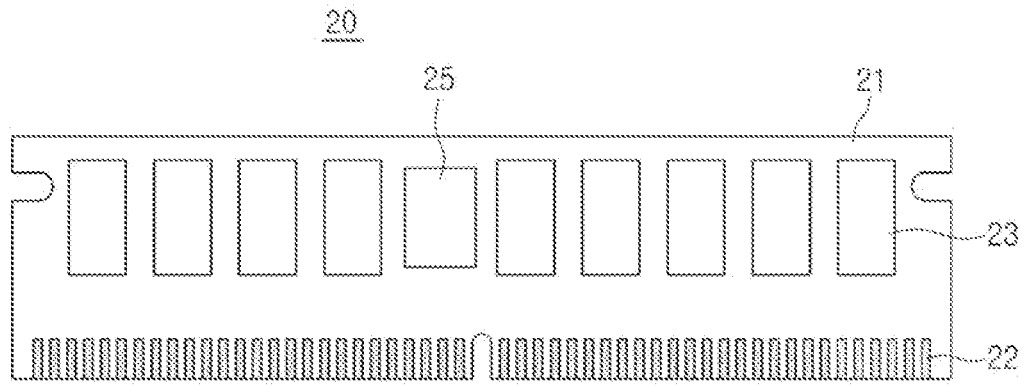
Figure 19B:
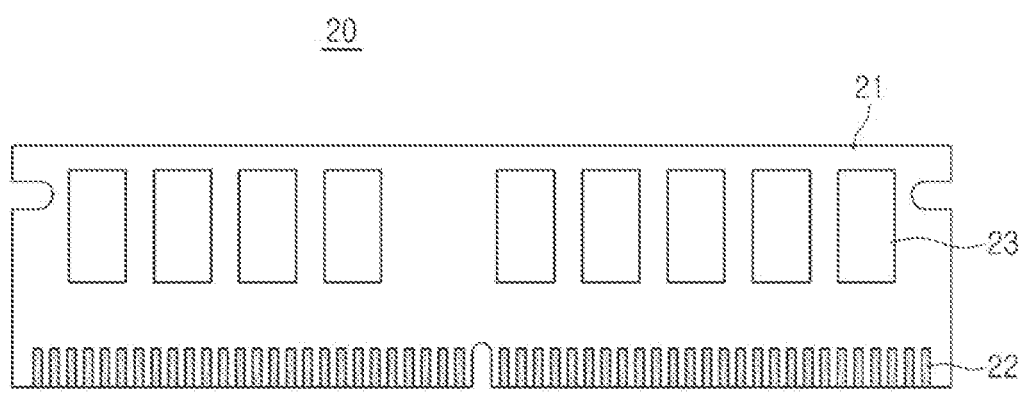

FIGS. 18A and 18B are views illustrating respective surfaces of a memory module according to an example embodiment. FIGS. 19A and 19B are views illustrating respective surfaces of a memory module according to an example embodiment.

First, the two surfaces of a memory module 10 according to an example embodiment, respectively illustrated in FIGS. 18A and 18B, may include a memory substrate 11, memory chips 13, memory buffer chips 14, a register clock driver 15, and the like. A main connector 12 may be disposed on one side of the memory substrate 11, and the main connector 12 may include a plurality of connector pins. The main connector 12 may be coupled to a memory module socket of a main board.

The memory chips 13 may be mounted on first and second, i.e., opposite, surfaces of the memory substrate 11. According to an example embodiment, the memory chips 13 may be mounted on only one of the first and second surfaces. The number of memory chips 13 mounted on the memory substrate 11 may be variously changed according to an example embodiment.

The memory buffer chips 14 may be mounted on the first surface of the memory substrate 11. The number of memory buffer chips 14 may be equal to or less than the number of memory chips 13. The register clock driver 15 may buffer a command/address signal received from a processor, to transmit the buffered signal to at least one of the memory chips 13. In example embodiments described with reference to FIGS. 18A and 18B, the register clock driver 15 is illustrated to be mounted on the first surface, but the register clock driver 15 may be mounted on the second surface or on the first and second surfaces.

Referring to FIG. 18B, an auxiliary connector 16 may be disposed on the second surface of a memory substrate 11. The auxiliary connector 16 may be coupled to a B2B connector for connecting the memory substrate 11 to a board substrate of a main board. To this end, a plurality of connector pins or a plurality of connector holes, corresponding to the B2B connector, may be formed in the auxiliary connector 16. The number of connector pins included in a main connector 12 may be identical to or different from the number of connector pins or connector holes included in the auxiliary connector 16.

Next, the two surfaces of a memory module 20 according to an example embodiment, respectively illustrated in FIGS. 19A and 19B, may include a memory substrate 21, memory chips 23, a register clock driver 25, and the like, respectively. A main connector 22 may be disposed on one side of the memory substrate 21, and the main connector 22 may include a plurality of connector pins. The main connector 22 may be coupled to a memory module socket of a main board.

The memory modules 20 may not include memory buffer chips. Therefore, each of the memory modules 20 may be coupled to a basic socket fixedly connected to a memory channel of the main board to directly communicate with a processor, or may exchange a signal with the processor through other memory modules. For example, when the memory module 20 is coupled to an extension socket, other than the basic socket, the memory module 20 may exchange a signal with the processor through other memory modules including memory buffer chips.

For example, the memory module 10 described with reference to FIGS. 18A and 18B may include memory buffer chips 14, and may thus be coupled to a basic socket fixedly connected to a memory channel of the main board. For example, the memory module 10 may be coupled to a basic socket to mediate signal transmission/reception between the processor and another memory module 20 coupled to the other extension socket. Alternatively, the memory module 10 may be coupled to an extension socket, and may mediate signal transmission/reception between the processor and another memory module 20 coupled to another extension socket. In this case, the memory module 20 through which the memory module 10 mediates the signal transmission/reception may be connected to the auxiliary connector 16 of the memory module 10 through a B2B connector.

Figure 20:
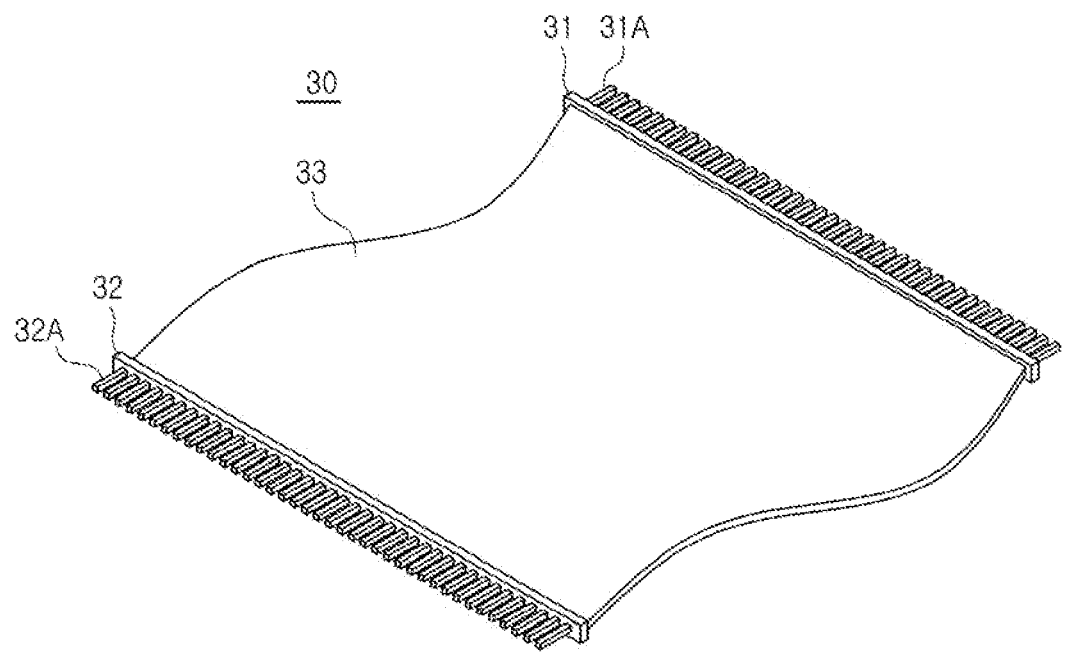
FIGS. 20 and 21 are views illustrating B2B connectors for coupling to a memory module according to example embodiments.
Figure 21:
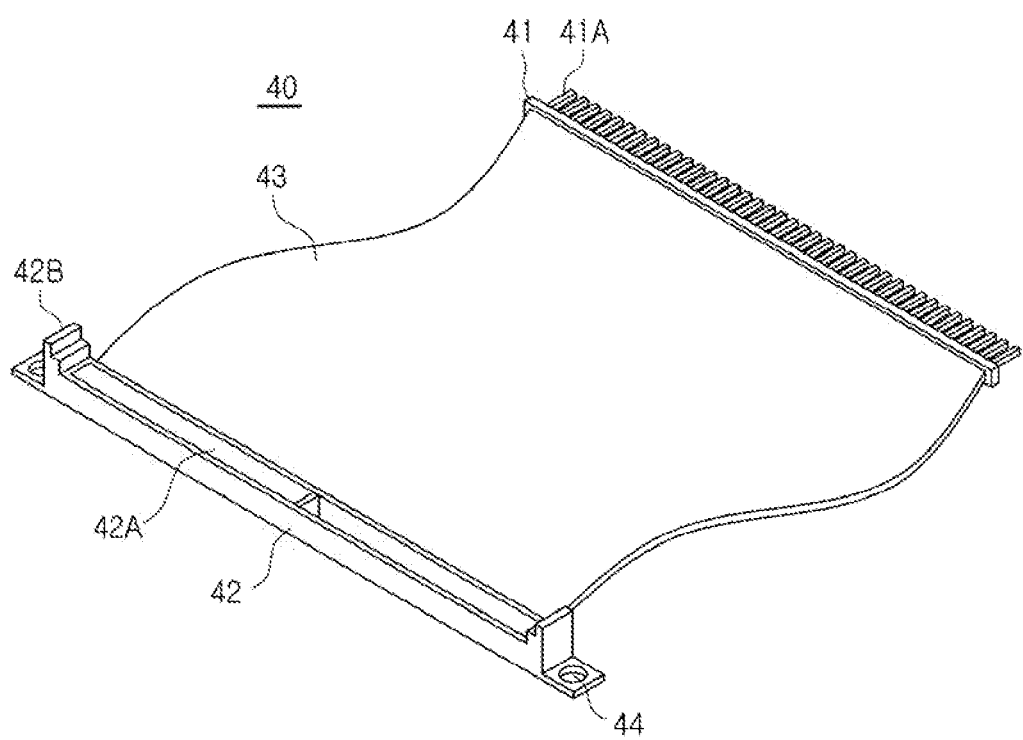

FIGS. 20 and 21 are views illustrating a B2B connector coupled to a memory module according to example embodiments.

First, referring to FIG. 20, a B2B connector 30 according to an example embodiment may include a first connector 31, a second connector 32, and a connection wiring portion 33 connecting the first connector 31 and the second connector 32. The connection wiring portion 33 may be formed of a material having flexibility.

The first connector 31 and the second connector 32 may include a plurality of connector pins 31A and 32A, respectively. The number of connector pins 31A included in the first connector 31 may be identical to the number of connector pins 32A included in the second connector 32. For example, the connector pins 31A included in the first connector 31 may be coupled to pinholes of an auxiliary connector formed in a memory module, and the connector pins 32A included in the second connector 32 may be coupled to pinholes of a board connector formed in a main board.

According to an example embodiment, at least one of the first connector 31 and the second connector 32 may include connector pinholes, instead of the connector pins 31A and 32A. In this case, connector pins may be formed in the auxiliary connector of the memory module coupled to the B2B connector 30 and/or the board connector of the main board, instead of the pinholes.

Next, referring to FIG. 21, a B2B connector 40 according to an example embodiment may include a first connector 41, an extension socket 42, and a connection wiring portion 43 connecting the first connector 41 and the extension socket 42. The first connector 41 may include a plurality of connector pins 41A to be coupled to an auxiliary connector of a memory module coupled to a memory module socket.

Unlike the B2B connector 30 described with reference to FIG. 20, in the example embodiment illustrated in FIG. 21, the B2B connector 40 may include the extension socket 42, instead of a second connector. For example, the extension socket 42 to which the memory module added for expansion of memory capacity is coupled may be provided integrally with the B2B connector 40, not a main board.

The extension socket 42 may include a fastening hole 42A to which the memory module is coupled, a fixing portion 42B for fixing the memory module coupled to the fastening hole 42A, and the like. A shape of the fastening hole 42A may be determined by classification of the memory module. According to an example embodiment, a fastening portion 44 capable of fixing the extension socket 42 to the main board may be formed. In an example embodiment, referring to FIG. 21, a method of fixing the fastening portion 44 and the main board using screws is illustrated as an example, but is not limited thereto.

Figure 22:
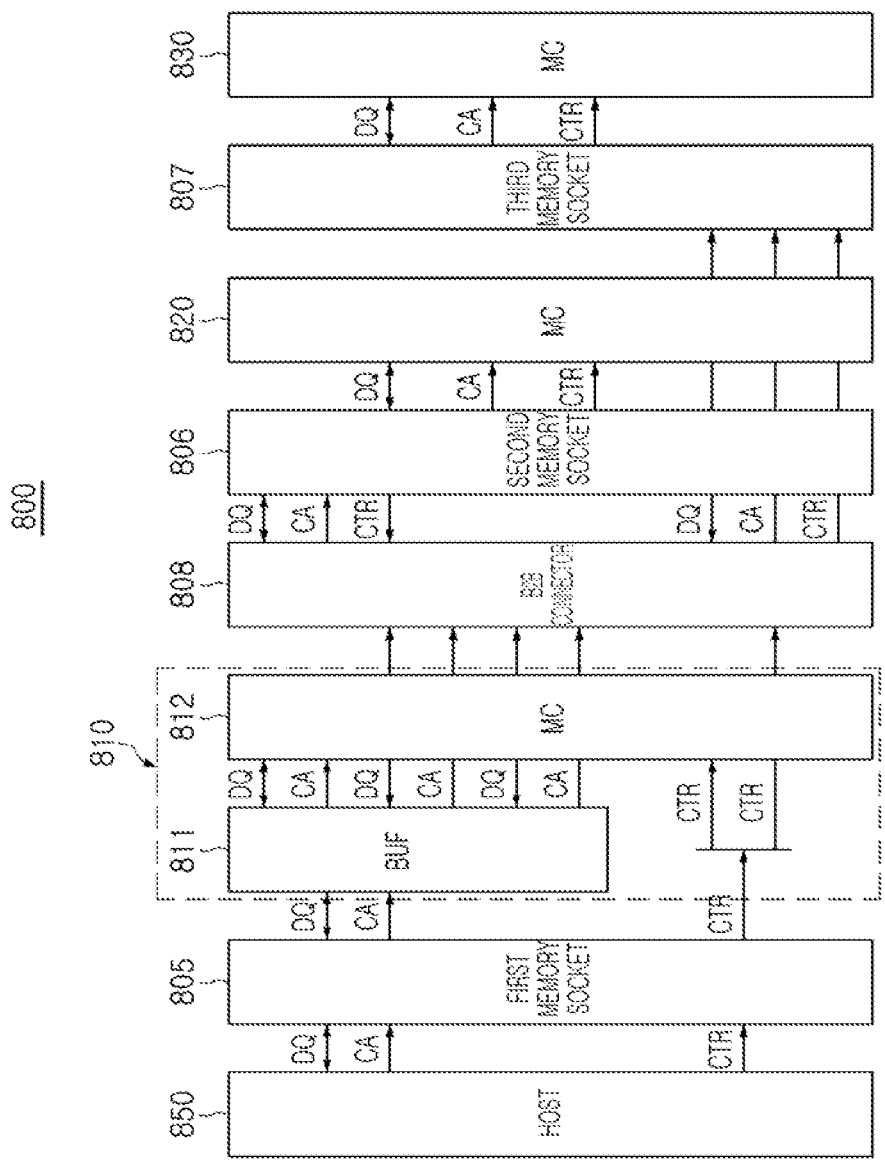
FIGS. 22 and 23 are views illustrating an operation of a server device according to an example embodiment.
Figure 23:
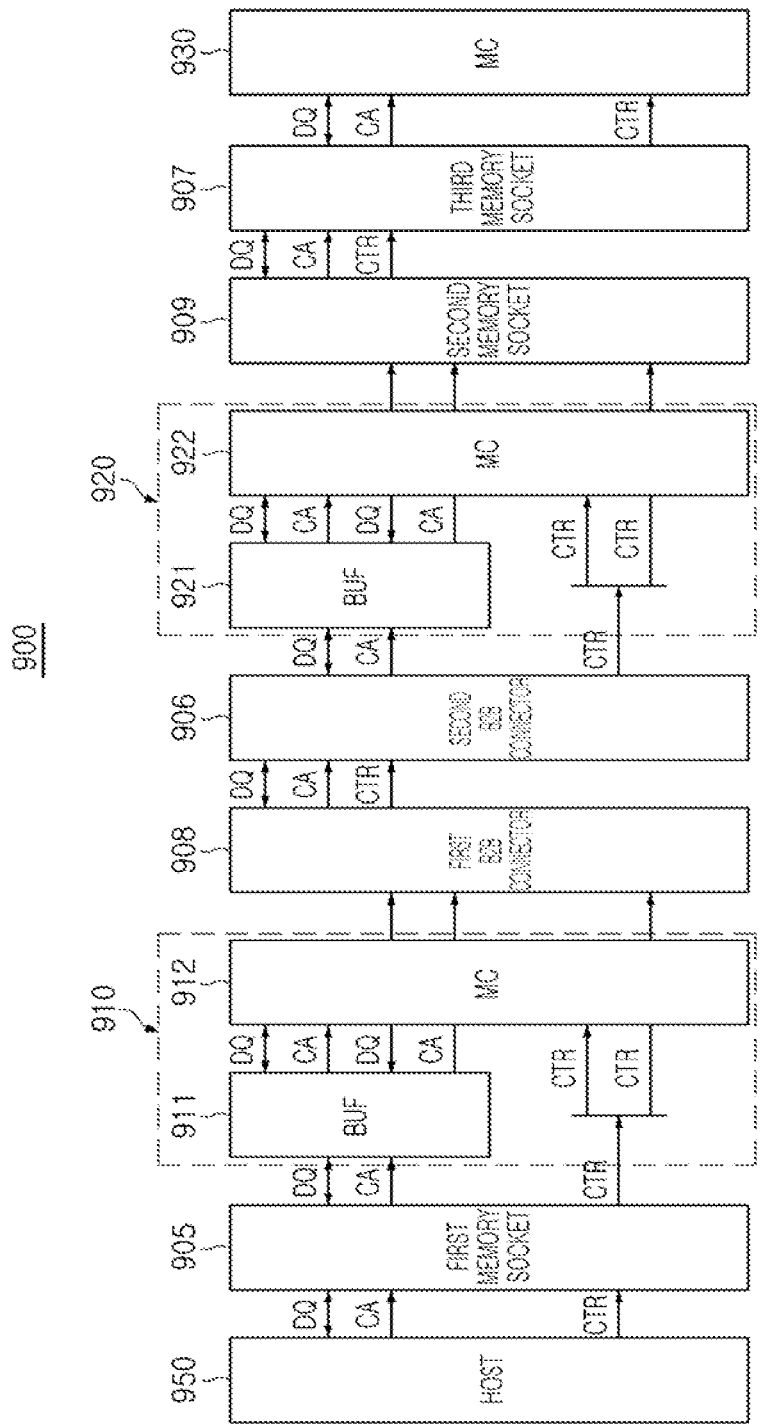

FIGS. 22 and 23 are views illustrating an operation of a server device according to an example embodiment.

First, referring to FIG. 22, a server device 800 according to an example embodiment may include a plurality of memory modules 810 to 830 and a host 850. The host 850 may be implemented as a processor including at least one core. The plurality of memory modules 810 to 830 and the host 850 may be mounted on a main board, and may exchange a signal with each other through wirings formed in a substrate of the main board. For example, the plurality of memory modules 810 to 830 may be coupled to a plurality of memory module sockets 805 to 807, respectively.

The host 850 may generate a command/address signal CA, a control signal CTR, or the like, to control operations of the memory modules 810 to 830, and may exchange a data signal DQ with the memory modules 810 to 830. The data signal DQ in which the host 850 receives from the memory modules 810 to 830 may include program data that the host 850 intends to write to the memory modules 810 to 830. The data signal DQ received by the host 850 from the memory modules 810 to 830 may include read data in which the host 850 request the memory modules 810 to 830.

The command/address signal CA, the data signal DQ, and the control signal CTR, output from the host 850, may be transmitted to a first memory module socket 805 through a channel wiring formed in the main board, and may be input to a first memory module 810 through connector pins formed in the first memory module socket 805. The first memory module 810 may include at least one memory buffer chip 811 in addition to memory chips 812, and the memory buffer chip 811 may buffer the data signal DQ and the command/address signal CA. According to an example embodiment, the first memory module 810 may include a register clock driver transmitting the command/address signal CA and the control signal CTR to the memory chips 812.

For example, the data signal DQ and the command/address signal CA buffered by the memory buffer chip 811 may be transmitted to a second memory module socket 806 or a third memory module socket 807 through a B2B connector 808. The control signal CTR may be input to the register clock driver in the first memory module 810 according to the memory modules 810 to 830 as targets or the second memory module socket 806, or may be transmitted to the third memory module socket 807 through the B2B connector 808.

The B2B connector 808 may transmit the data signal DQ, the command/address signal CA, and the control signal CTR to one of the second memory module socket 806 and the third memory module socket 807. In an example embodiment, referring to FIG. 22, both the second memory module socket 806 and the third memory module socket 807 may be connected to the B2B connector 808 in common. Therefore, the data signal DQ and the command/address signal CA for controlling the second memory module 820, and the data signal DQ and the command/address signal CA for controlling the third memory module 830 may all be output from the B2B connector 808 coupled to the first memory module 810.

The memory buffer chip 811 of the first memory module 810 may be configured to output the data signal DQ and the command/address signal CA to the second memory module 820 or the third memory module 830. Since the second memory module 820 and the third memory module 830 may communicate with the host 850 through the first memory module 810 and may not output the data signal DQ, the command/address signal CA, the control signal CTR, or the like to other memory modules, the memory buffer chip may not be included. Therefore, the second memory module 820 and the third memory module 830 may have different structures from the first memory module 810.

Next, referring to FIG. 23, a server device 900 according to an example embodiment may include a plurality of memory modules 910 to 930 and a host 950. The host 950 may be implemented as a processor including at least one core. The plurality of memory modules 910 to 930 and the host 950 may be mounted on a main board, and may exchange a signal with each other through wirings formed in a substrate of the main board. The plurality of memory modules 910 to 930 may be coupled to a plurality of memory module sockets 905 to 907, respectively.

The host 950 may generate a command/address signal CA, a control signal CTR, or the like, to control operations of the memory modules 910 to 930, and may exchange a data signal DQ with the memory modules 910 to 930. The command/address signal CA, the data signal DQ, and the control signal CTR, output from the host 950, may be input to a first memory module 910 through channel wiring formed in the main board and a first memory module socket 905. The first memory module 910 may include at least one memory buffer chip 911 and memory chips 912, and the memory buffer chip 911 may buffer the data signal DQ and the command/address signal CA.

For example, the data signal DQ and the command/address signal CA, buffered by the memory buffer chip 911, may be transmitted to a second memory module socket 906 through a first B2B connector 908. The control signal CTR may be input to a register clock driver in the first memory module 910 or may be transmitted to the second memory module socket 906 through the first B2B connector 908.

A second memory module 920 coupled to the second memory module socket 906 may operate according to the command/address signal CA and the control signal CTR, received through the first memory module 910, and may exchange the data signal DQ with the host 950 through the memory buffer chip 911 of the first memory module 910. The second memory module 920 may execute a program operation of writing data of the data signal DQ based on the command/address signal CA and the control signal CTR received through the first B2B connector 908, or may execute a read operation of generating a data signal DQ including read data.

In another implementation, a memory buffer chip 921 of the second memory module 920 may buffer the data signal DQ and the command/address signal CA, and may output the buffered signals to a second B2B connector 909. In this case, the control signal CTR may also be output to the second B2B connector 909. The second B2B connector 909 may be a connector connected between the second memory module 920 and a third memory module socket 907. Therefore, a third memory module 930 may operate by the control signal CTR and the command/address signal CA.

In an example embodiment, the third memory module 930 may have a structure different from that of the first memory module 910 and the second memory module 920. Referring to FIG. 23, unlike the first memory module 910 and the second memory module 920, the third memory module 930 may not include a memory buffer chip. Therefore, the control signal CTR and the command/address signal CA, received through the second B2B connector 909, may not be transmitted to other memory modules, and may be used to control the third memory module 930.

A method of connecting a processor, a host, and a memory module according to an example embodiment may be applied to a general computer device as well as a server device. Personal computers may also use a large amount of memory, or may implement high-speed operation. When the high-speed operation is called for, a computer device may be implemented by connecting a memory module to a basic socket provided for each memory channel. When a large amount of memory is called for, memory module sockets provided by a main board for each of the memory channels may be connected to each other by a B2B connector, or memory module sockets integrated with the B2B connector may be added in an extension space provided by the main board for each of the memory channels, to expand memory capacity. It will be understood that example embodiments are not limited to a server device, and may be expanded to a computer device including a processor and memory modules connected through the processor and the memory channels.

According to an example embodiment, the number of memory module sockets and the number of memory modules, connected to a memory channel, may be increased, as desired, by using a board-to-board (B2B) connector coupled to a memory module. Since not only the number of memory modules but also the number of memory module sockets connected to a processor through a memory channel may be changed, a server device may be optimally configured, as desired.

By way of summation and review, in order to increase the capacity of the memory, the number of memory channels connecting the processor and the memory may increase, or the number of memory modules connected to one (1) memory channel may increase.

As described above, embodiments may provide a memory module, a main board, and a server device, advantageous in operating at a high speed and processing high capacity data, by changing the number of memory modules capable of being connected to one (1) memory channel, as desired.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A server device, comprising:
    a main board including a processor socket, a first memory module socket, a second memory module socket, a board connector an extension wiring and a channel wiring connecting the processor socket to the first memory module socket;
    a processor coupled to the processor socket;
    a first memory module connected to the first memory module socket;
    a board-to-board (B2B) connector coupled to the first memory module; and
    a second memory module connected to the second memory module socket, wherein:
    the first memory module is connected to the processor by the channel wiring, and
    the second memory module is connected to the processor by the channel wiring, the first memory module, the B2B connector, the board connector, and the extension wiring,
    the first memory module socket and the second memory module socket are integrally coupled to the main board,
    the board connector is connected to the B2B connector and disposed between the first memory module socket and the second memory module socket, and
    the extension wiring connects the board connector to the second memory module socket.

2. The server device as claimed in claim 1, further comprising:
    a third memory module, wherein:

the board connector is provided in plural to include a first board connector disposed between the first memory module socket and the second memory module socket, and a second board connector, the extension wiring is provided in plural to include a first extension wiring connected between the first board connector and the second memory module socket, and a second extension wiring, the main board further includes a third memory module socket coupled to the third memory module, the third memory module is connected to the processor by the channel wiring, the first memory module, the first B2B connector, the first board connector, the first extension wiring, the second memory module, a second B2B connector connected to the second board connector, and the second extension wiring connected between the second board connector and the third memory module socket, the third memory module socket, is different from the first memory module socket and the second memory module socket, and each of the second memory module and the third memory module has a different structure from the first memory module.

3. The server device as claimed in claim 2, wherein the first memory module includes a memory buffer chip configured to transmit at least one of a data signal and a command/address signal received from the processor to at least one of the second memory module and the third memory module.

4. The server device as claimed in claim 1, wherein:
the main board further includes a third memory module socket different from the first memory module socket and the second memory module socket, the board connector is provided in plural to include a first board connector and a second board connector, the first board connector is disposed between the first memory module socket and the second memory module socket, and the second board connector is disposed between the third memory module socket and the second memory module socket.

5. The server device as claimed in claim 4, further comprising:
a third memory module connected to the third memory module socket, wherein;

an extension wiring is provided in plural to include a first extension wiring connected between the first board connector and the second memory module socket, and a second extension wiring, the third memory module, is connected to the processor by the second extension wiring, a second (B2B) connector connected between the second board connector and the second memory module, the second memory module, the first extension wiring the first B2B connector, the first memory module, and the channel wiring, and the second extension wiring is connected between the second board connector and the third memory module socket.

6. The server device as claimed in claim 5, wherein the third memory module has a different structure from the first memory module and the second memory module, and
each of the first memory module and the second memory module has the same structure.

7. The server device as claimed in claim 6, wherein the number of semiconductor chips included in the third memory module is less than the number of semiconductor chips included in the first memory module.

8. A server device, comprising:
a main board including a processor socket, a first memory module socket, a second memory module socket, a channel wiring, a board connector, and an extension wiring;
a processor coupled to the processor socket;
a first memory module connected to the first memory module socket;
a board-to-board (B2B) connector connecting the first memory module to the board connector; and
a second memory module connected to the second memory module socket, wherein:
the first memory module is connected to the processor by the channel wiring, and
the second memory module is connected to the processor by:
the channel wiring connecting the processor socket to the first memory module socket,
the first memory module,
the B2B connector,
the board connector, and
the extension wiring connecting the board connector to the second memory module socket.

\* \* \* \* \*